United States Patent
Moen et al.

(10) Patent No.: US 10,062,712 B1
(45) Date of Patent: Aug. 28, 2018

(54) METHOD TO FABRICATE BOTH FD-SOI AND PD-SOI DEVICES WITHIN A SINGLE INTEGRATED CIRCUIT

(71) Applicant: Newport Fab, LLC, Newport Beach, CA (US)

(72) Inventors: Kurt A. Moen, Tustin, CA (US); Paul D. Hurwitz, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 15/660,104

(22) Filed: Jul. 26, 2017

(51) Int. Cl.
| | |
|---|---|
| *H01L 21/8234* | (2006.01) |
| *H01L 27/12* | (2006.01) |
| *H01L 29/06* | (2006.01) |
| *H01L 23/535* | (2006.01) |
| *H01L 29/08* | (2006.01) |
| *H01L 21/02* | (2006.01) |
| *H01L 21/84* | (2006.01) |
| *H01L 21/762* | (2006.01) |

(Continued)

(52) U.S. Cl.
CPC .... *H01L 27/1203* (2013.01); *H01L 21/02238* (2013.01); *H01L 21/31053* (2013.01); *H01L 21/31111* (2013.01); *H01L 21/31144* (2013.01); *H01L 21/76283* (2013.01); *H01L 21/84* (2013.01); *H01L 23/535* (2013.01); *H01L 27/0207* (2013.01); *H01L 29/0649* (2013.01); *H01L 29/0847* (2013.01); *H01L 21/02255* (2013.01); *H01L 21/7624* (2013.01); *H01L 21/76264* (2013.01); *H01L 21/823412* (2013.01); *H01L 21/823481* (2013.01)

(58) Field of Classification Search
CPC .......... H01L 21/7624; H01L 21/76264; H01L 21/823412; H01L 21/823481
USPC ......................................................... 438/275
See application file for complete search history.

(56) References Cited

U.S. PATENT DOCUMENTS

| | | | |
|---|---|---|---|
| 6,222,234 B1 * | 4/2001 | Imai ................. | H01L 21/84 |
| | | | 257/347 |
| 2004/0079993 A1 * | 4/2004 | Ning ................. | H01L 21/84 |
| | | | 257/347 |

(Continued)

OTHER PUBLICATIONS

M. Jaffe et al., "Improvements in SOI Technology for RF Switches," in SiRF Digest, 2015, pp. 30-32.

(Continued)

*Primary Examiner* — George Fourson, III
(74) *Attorney, Agent, or Firm* — Bever, Hoffman & Harms, LLP

(57) ABSTRACT

Methods for fabricating both PD-SOI devices and FD-SOI devices on the same semiconductor substrate are provided. The methods begin with a SOI wafer having a top silicon layer with a thickness appropriate for the fabrication of PD-SOI devices. During the fabrication process, portions of the top silicon layer, to be used for the fabrication of FD-SOI devices, are selectively thinned, so that a portion of the wafer has a top silicon thickness appropriate for FD-SOI devices. FD-SOI devices (e.g., RF switch transistors) are fabricated in the thinned portions of the top silicon layer, and PD-SOI devices (e.g., control transistors for the RF switch transistors) are fabricated in the non-thinned portions of the top silicon layer. Thus, both PD-SOI and FD-SOI devices can be combined within the same integrated circuit.

11 Claims, 25 Drawing Sheets

(51) Int. Cl.
  *H01L 21/3105* (2006.01)
  *H01L 21/311*  (2006.01)
  *H01L 27/02*   (2006.01)

(56) References Cited

U.S. PATENT DOCUMENTS

| | | | | |
|---|---|---|---|---|
| 2004/0173850 | A1* | 9/2004 | Yeo | H01L 21/76264 |
| | | | | 257/350 |
| 2004/0180478 | A1* | 9/2004 | Yang | H01L 21/7624 |
| | | | | 438/154 |
| 2004/0259295 | A1* | 12/2004 | Tomiye | H01L 21/84 |
| | | | | 438/155 |
| 2004/0262647 | A1* | 12/2004 | Okihara | H01L 27/1203 |
| | | | | 257/241 |
| 2007/0235806 | A1* | 10/2007 | Joshi | H01L 21/84 |
| | | | | 257/348 |
| 2016/0254145 | A1* | 9/2016 | Triyoso | H01L 21/02236 |
| | | | | 257/616 |
| 2017/0345724 | A1* | 11/2017 | Costaganna | H01L 21/84 |

OTHER PUBLICATIONS

B. S. a Vitale, P. W. Wyatt, M. Leee, N. Checka, J. Kedzierski, and C.L. Keast, "FDSOI Process Technology for Ultralow-Power Eletronics," Proc. IEEE, vol. 98, pp. 333-342, 2010.

* cited by examiner

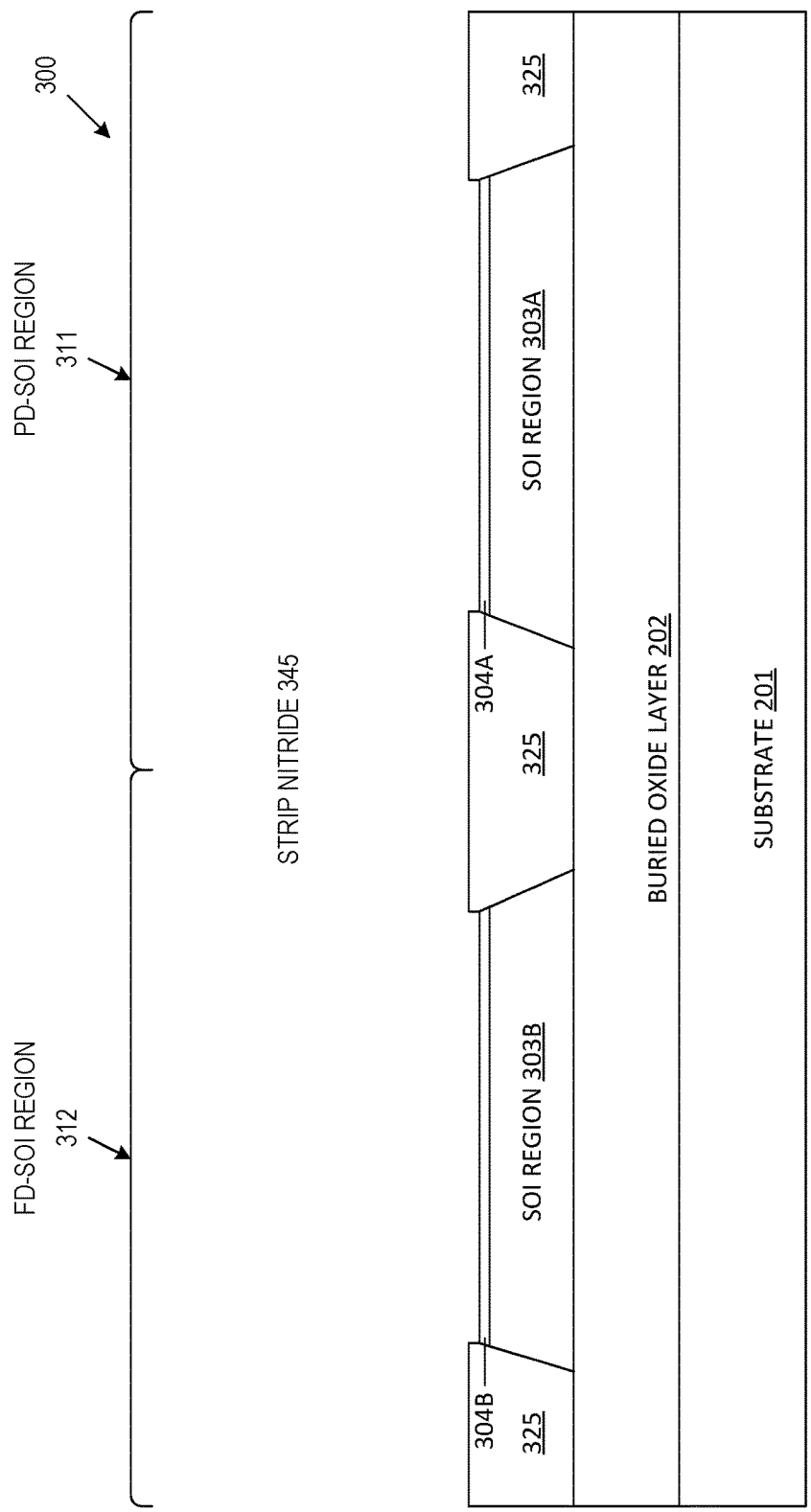

METHOD TO FABRICATE BOTH FD-SOI AND PD-SOI DEVICES WITHIN A SINGLE INTEGRATED CIRCUIT

FIELD OF THE INVENTION

The present invention relates to a method of fabricating both fully depleted silicon-on-insulator (FD-SOI) devices and partially depleted silicon-on-insulator (PD-SOI) devices on the same semiconductor substrate.

RELATED ART

Silicon-on-insulator (SOI) CMOS technologies provide significant performance and cost advantages for a wide variety of radio frequency (RF) applications, and as such, have become the preferred technology platform for many RF integrated circuit products. In particular, SOI-based technologies that employ a thin top silicon layer (e.g., having a thickness of less than 1500 Angstroms) have numerous benefits, including SOI transistors that exhibit reduced source and drain junction capacitances, low resistance in the on-state, high linearity (due to low harmonic generation that avoids mixing of unwanted signals in nearby frequency bands), and low cost. Moreover, SOI-based technologies employ a simplified process that provides full dielectric isolation and enables reduced circuit sizes. These advantages enable the design of low-cost, highly-integrated RF circuits with superior performance (e.g., improved metrics such as attenuation, power, and isolation).

SOI CMOS devices can be divided into those that are partially-depleted (PD-SOI) and fully-depleted (FD-SOI) during device operation, with each having its own advantages and limitations. PD-SOI transistors are formed in a top silicon layer having a relatively large thickness (e.g., about 70 nm or more), such that the depletion region of the PD-SOI transistor does not extend entirely to the bottom of the top silicon layer when the transistor is turned on. In contrast, FD-SOI devices are formed in a top silicon layer having a relatively small thickness (e.g., about 60 nm or less), such that the depletion region of the FD-SOI transistor extends through the entire thickness of the top silicon layer when the transistor is turned on.

PD-SOI transistors are relatively easy to manufacture and provide all of the aforementioned benefits of SOI transistors, but are subject to floating body effects, where the body potential of the transistor can shift over time based on the history of transistor operation. FD-SOI transistors, on the other hand, have reduced floating body effects, improved transconductance, reduced junction capacitance, and better electrostatic control via the gate. However, FD-SOI transistors are more challenging to manufacture, and the threshold voltage of an FD-SOI device is a strong function of the top silicon layer thickness and trapped charge in the buried oxide layer that underlies the top silicon layer. Moreover, pure FD-SOI technologies require tight silicon film thickness control to minimize threshold voltage variation, which increases the cost of the bare SOI wafers used in the fabrication of FD-SOI transistors.

Stacks of high voltage SOI field effect transistors (FETs) are used to form RF switches between ports (e.g., to route RF signals from an antenna to a receive port or from a transmit port to the antenna). For an RF switch, the on-resistance of the switch ($R_{ON}$) multiplied by the off-capacitance of the switch ($C_{OFF}$) is a key figure of merit, which dictates the ability to transmit RF power with low losses through the on-state RF switch, while maintaining adequate isolation across the off-state RF switch.

Existing PD-SOI technologies have improved the $R_{ON} \times C_{OFF}$ figure of merit by careful engineering of the device geometries and process conditions to reduce gate overlap, junction capacitances, and channel and source/drain resistances, all while maintaining sufficient RF voltage handling capability. One method to reduce the $R_{ON} \times C_{OFF}$ value of a PD-SOI transistor is to reduce the device silicon thickness to lower the junction capacitance. Continued thinning of the device silicon thickness would advantageously enable (1) lower junction capacitance and (2) improved off-state voltage handling (due to stronger electrostatic control by the gate). However, below a certain thickness the PD-SOI transistor will become fully-depleted and impose the constraints associated with FD-SOI devices. After reducing to a device silicon thickness of ~800-1000 Å, improvements to the $R_{ON} \times C_{OFF}$ product for PD-SOI technologies are restricted to factors other than channel thickness. These typically require process modifications that increase manufacturing complexity and cost, such as additional implants, channel stress engineering and reducing back end of line (BEOL) parasitics.

In a typical RF switch product, for FETs implemented outside of the RF switch (e.g. digital control, and analog circuitry such as charge pumps), FD-SOI threshold voltage sensitivity requires additional manufacturing controls to limit the top silicon layer and buried oxide thickness variation across the wafer, increasing manufacturing cost. FETs employed within the RF switch itself, however, are more tolerant of threshold voltage variation, and do not require additional manufacturing controls, even if realized as FD-SOI transistors.

It would therefore be desirable to have improved methods and structures for implementing both FD-SOI CMOS transistors and PD-SOI CMOS transistors on the same integrated circuit.

SUMMARY

Accordingly, the present invention provides a semiconductor structure that includes a substrate, a buried dielectric layer located over the substrate, a first silicon region located on the buried dielectric layer, wherein the first silicon region has a first thickness, and a second silicon region located on the buried oxide layer, wherein the second silicon region has a second thickness, less than the first thickness. In one embodiment, the first thickness is about 700 to 900 Angstroms, and the second thickness is about 300 to 600 Angstroms. A PD-SOI device is fabricated in the first silicon region, and a FD-SOI device is fabricated in the second silicon region. In one embodiment, source/drain regions of the PD-SOI transistor and the FD-SOI transistor are formed from the same set of dopant implants. Shallow trench isolation (STI) regions laterally isolate the PD-SOI transistor from the FD-SOI transistor. In a particular application, the FD-SOI transistor is included in a radio frequency (RF) switch, and the PD-SOI transistor is included in circuitry used for controlling the RF switch.

In accordance with another embodiment, a method for fabricating a PD-SOI device and a FD-SOI device on a common substrate includes: forming a first mask over a first region of a silicon top layer having a first thickness (T1), oxidizing a second region of the silicon top layer that is exposed through the first mask, thereby forming an oxide layer that reduces the thickness of the silicon top layer in the second region to a second thickness (T2), removing the first mask and the oxide layer, and then fabricating a PD-SOI transistor in the first region of the silicon layer, and fabricating a FD-SOI transistor in the second region of the silicon layer. In accordance with one embodiment, STI regions are fabricated between the PD-SOI transistor and the FD-SOI transistor.

In accordance with an alternate embodiment, a method for fabricating a PD-SOI device and a FD-SOI device on a common substrate includes forming an SOI structure including a first SOI region, a second SOI region and STI regions located between the first and second SOI regions, wherein the first SOI region, the second SOI region and the STI regions have co-planar upper surfaces and a first thickness (T1). A first mask is formed over the first SOI region, wherein the first mask exposes the second SOI region. The second SOI region is thermally oxidized through the first mask, thereby forming an oxide layer that reduces the thickness of the second SOI region to a second thickness (T2). The oxide layer and the first mask are removed. A PD-SOI transistor is then fabricated in the first SOI region, and a FD-SOI transistor is fabricated in the second SOI region.

The present invention will be more fully understood in view of the following description and drawings.

BRIEF DESCRIPTION OF THE DRAWINGS

FIGS. 3A, 3B, 3C, 3D, 3E, 3F, 3G, 3H, 3I, 3J and 3K are cross sectional views of a semiconductor structure including a PD-SOI transistor and a FD-SOI transistor during various stages of fabrication in accordance with an alternate embodiment of the present invention.

DETAILED DESCRIPTION

In general, the present invention provides methods for fabricating both PD-SOI devices and FD-SOI devices on the same semiconductor substrate. In one embodiment, the method begins with a SOI wafer having a top silicon layer with a thickness appropriate for the fabrication of PD-SOI devices. During the fabrication process, portions of the top silicon layer to be used for the fabrication of FD-SOI devices are selectively thinned, so that a portion of the wafer has a top silicon thickness appropriate for FD-SOI devices. FD-SOI devices (e.g., RF switch transistors) are fabricated in the thinned portions of the top silicon layer, and PD-SOI devices (e.g., control transistors for the RF switch transistors) are fabricated in the non-thinned portions of the top silicon layer. Thus, both PD-SOI and FD-SOI devices can be combined within the same integrated circuit.

The present invention will now be described in more detail.

Figure 1:
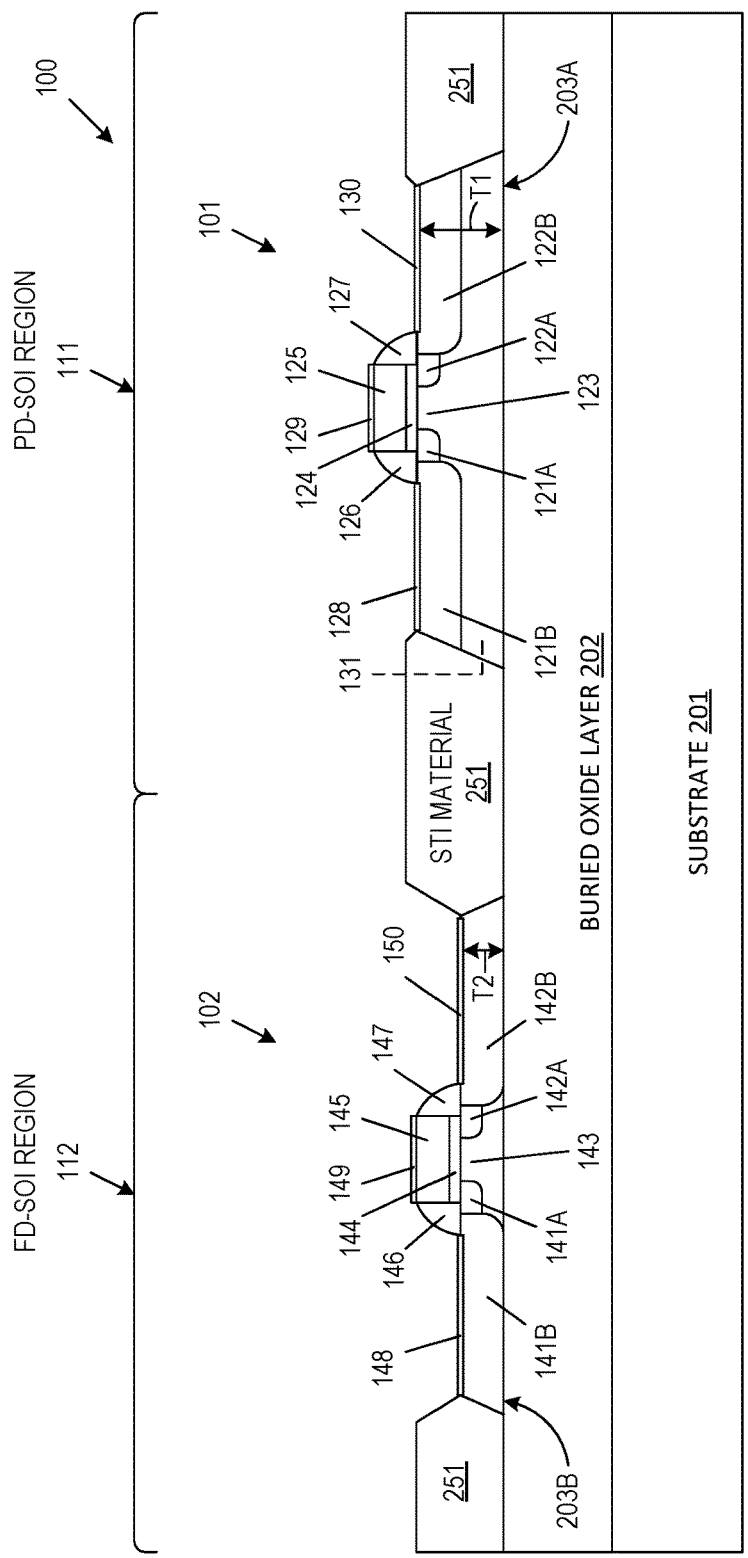
FIG. 1 is a cross sectional view of a semiconductor structure including a PD-SOI transistor and a FD-SOI transistor fabricated on the same substrate in accordance with one embodiment of the present invention.

FIG. 1 is a cross-sectional view of an SOI structure 100 that includes a PD-SOI device 101 formed in a PD-SOI region 111 and a FD-SOI device 102 formed in a FD-SOI region 112. PD-SOI device 101 and FD-SOI device 102 are fabricated over a buried dielectric layer 202, which is located over a high-resistance substrate 201. More specifically, PD-SOI device 101 is fabricated in a semiconductor region 203A having a first thickness T1, and FD-SOI device 102 is fabricated in a second semiconductor region 203B having a second thickness T2, wherein the first thickness T1 is greater than the second thickness T2. The first and second semiconductor regions 203A and 203B are located over buried dielectric layer 202, and are electrically isolated from one another by shallow trench isolation (STI) material 251. In the illustrated embodiments, buried dielectric layer 202 is silicon oxide having a thickness of about 4000 Angstroms.

PD-SOI device 101 is a transistor having lightly doped source/drain regions 121A-122A, source/drain contact regions 121B-122B, channel/body region 123, gate dielectric 124, polysilicon gate electrode 125, dielectric sidewall spacers 126-127 and metal silicide structures 128-130. In one embodiment, PD-SOI transistor 101 is an n-channel device, wherein source/drain regions 121A-121B and 122A-122B are n-type regions and the channel/body region 123 is a p-type region. Body-biasing of PD-SOI transistors 101 is accomplished via a separate connection 131 to the body/channel region 123, which exists outside the cross-sectional view of FIG. 1. It is understood that multiple n-channel PD-SOI transistors can be fabricated in PD-SOI region 111. It is further understood that p-channel PD-SOI transistors (not shown) can be fabricated in PD-SOI region 111 by reversing the conductivity types of the source/drain regions 121A-121B and 122A-122B and the channel/body region 123.

FD-SOI device 102 is a transistor having lightly doped source/drain regions 141A-142A, source/drain contact regions 141B-142B, channel/body region 143, gate dielectric 144, gate electrode 145, dielectric sidewall spacers 146-147 and metal silicide structures 148-150. In one embodiment, FD-SOI transistor 102 is an n-channel device, wherein source/drain regions 141A-141B and 142A-142B are n-type regions and the channel/body region 143 is a p-type region. Again, it is understood that multiple n-channel FD-SOI transistors can be fabricated in FD-SOI region 112. It is further understood that p-channel FD-SOI transistors (not shown) can be fabricated in FD-SOI region 112 by reversing the conductivity types of the source/drain regions 141A-141B and 142A-142B and the channel/body region 143.

Figure 2A:
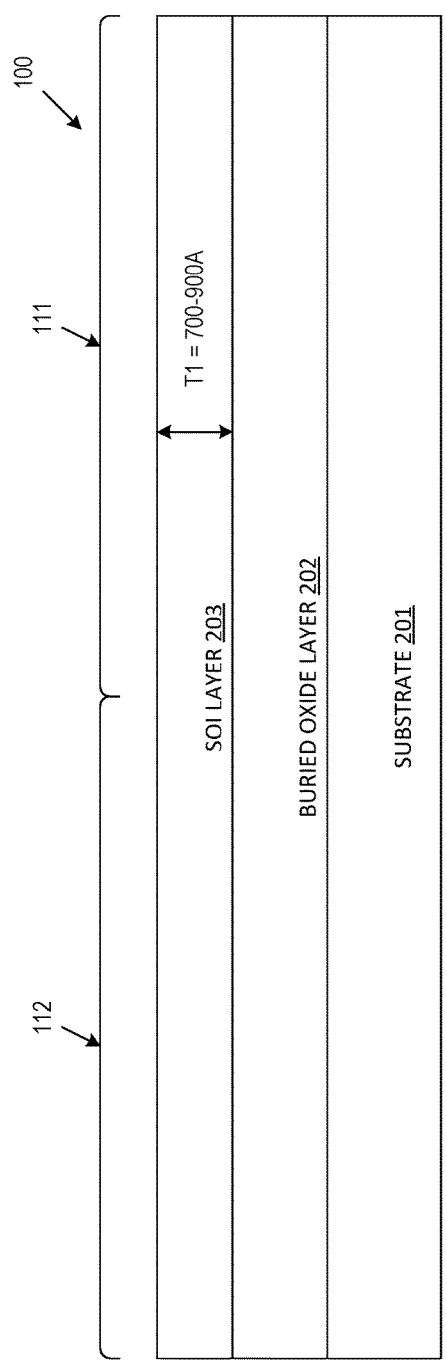
FIGS. 2A, 2B, 2C, 2D, 2E, 2F, 2G, 2H, 2I, 2J, 2K, 2L and 2M are cross sectional views of the semiconductor structure of FIG. 1 during various stages of fabrication in accordance with one embodiment of the present invention.

The fabrication of SOI structure 100 will now be described. FIGS. 2A-2M are cross-sectional views of SOI structure 100 during various stages of fabrication in accordance with a first embodiment of the present invention. As illustrated by FIG. 2A, buried oxide layer 202 is formed over substrate 201, and a thin monocrystalline silicon layer 203 is located over buried oxide layer 202. In one embodiment, substrate 201 is a high-resistance handle wafer, which is used to reduce substrate losses associated with RF switches (and passive devices) associated with SOI structure 100. In a particular embodiment, substrate 201 is p-type monocrystalline silicon having a resistivity greater than 500 Ω-cm, and a thickness of about 725 microns. Buried oxide layer 202 may be silicon oxide having a thickness in the range of about 1000 to 10000 Angstroms. In one embodiment, thin silicon layer 203 has a thickness T1 of about 700 to 900 Angstroms, although other thicknesses are possible in other embodiments. The thickness T1 is selected to correspond with the appropriate silicon thickness for the fabrication of a PD-SOI transistor. In general, thin silicon layer 203 may be referred to as a PD-SOI layer, because PD-SOI CMOS transistors (e.g., PD-SOI transistor 101) are fabricated in this thin silicon layer 203. The fabrication of substrate 201, buried oxide layer 202 and SOI layer 203 can be implemented in accordance with conventional SOI CMOS process technologies.

Figure 2B:
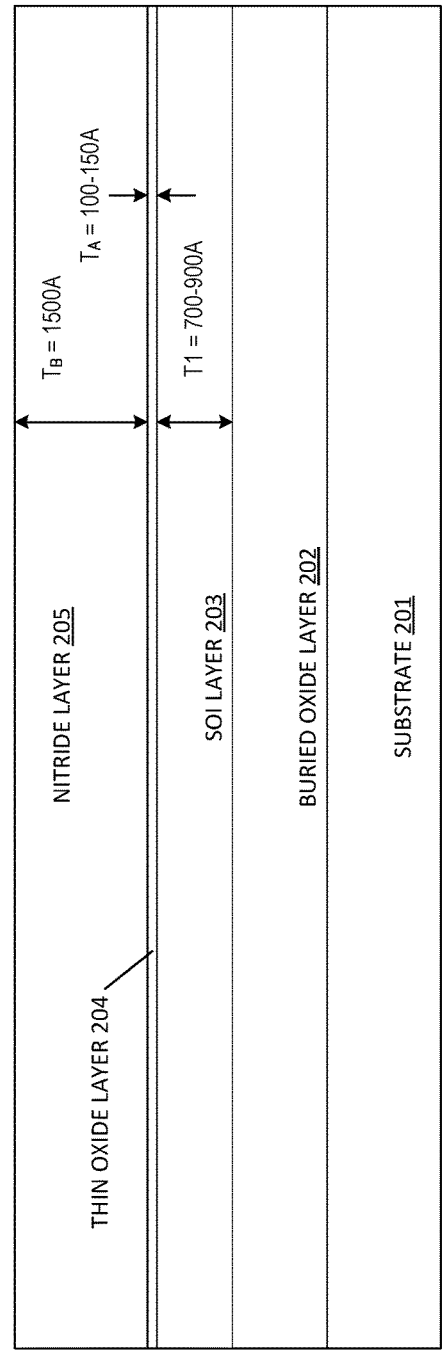

As illustrated by FIG. 2B, a stack including silicon oxide layer 203 and silicon nitride layer 205 is deposited over SOI layer 203. In accordance with one embodiment, silicon oxide layer 204 has a thickness $T_A$ of about 100-150 Angstroms, and silicon nitride layer 205 has a thickness $T_B$ of about 1500 Angstroms. Silicon oxide layer 204 and silicon nitride layer 205 protect SOI layer 203 during subsequent processing steps, in a manner that will become apparent in view of the following description.

Figure 2C:
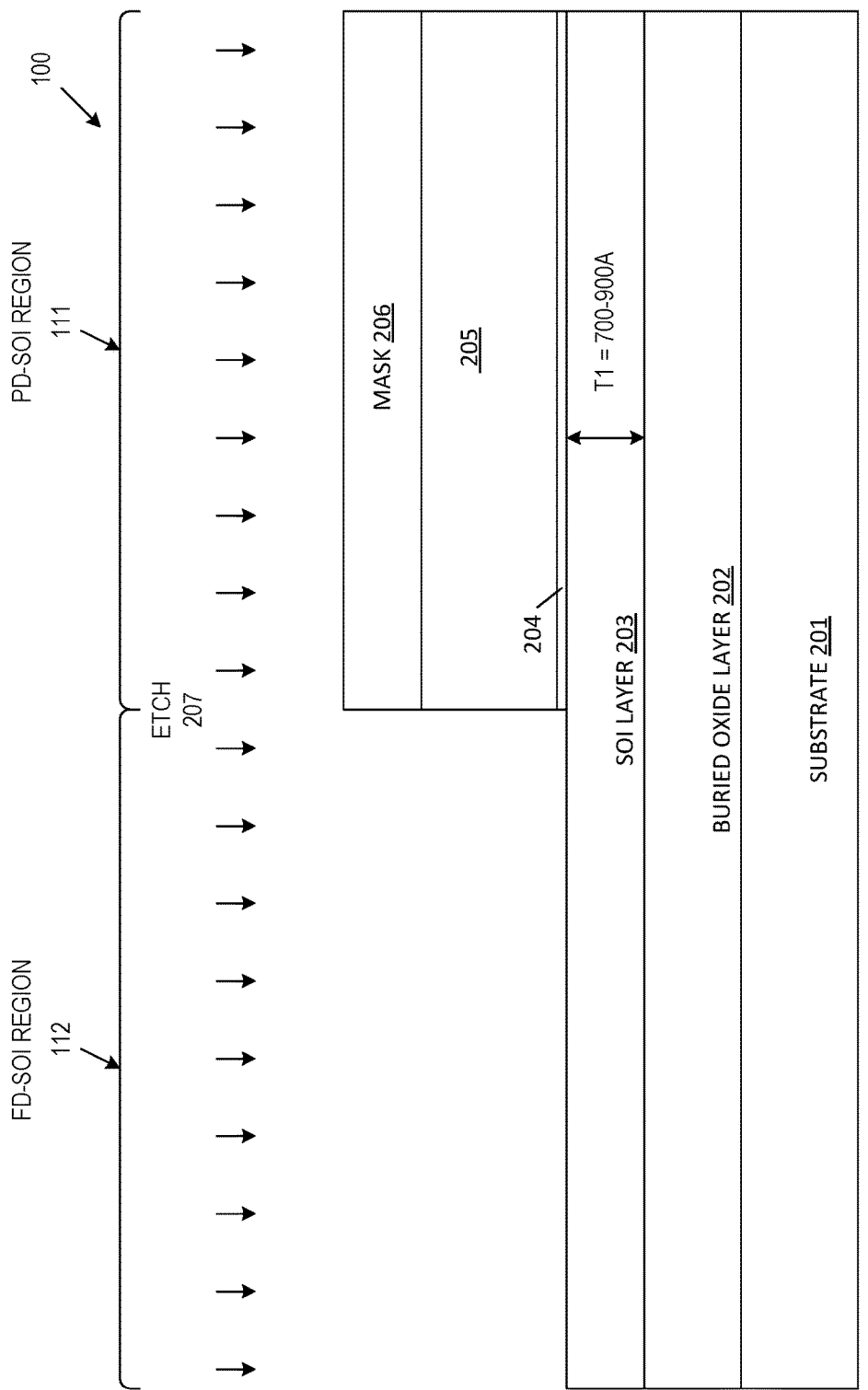

As illustrated by FIG. 2C, a first mask 206 is formed over silicon nitride layer 205, wherein the first mask 206 covers the PD-SOI region 111 and exposes the FD-SOI region 112. A series of etches 207 are performed through first mask 206, removing exposed portions of silicon nitride layer 205 and silicon oxide layer 204. As described in more detail below, FD-SOI devices (such as FD-SOI device 102) are formed in the regions exposed by the first mask 206, and PD-SOI devices (such as PD-SOI device 101) are formed in the regions covered by the first mask 206.

Figure 2D:
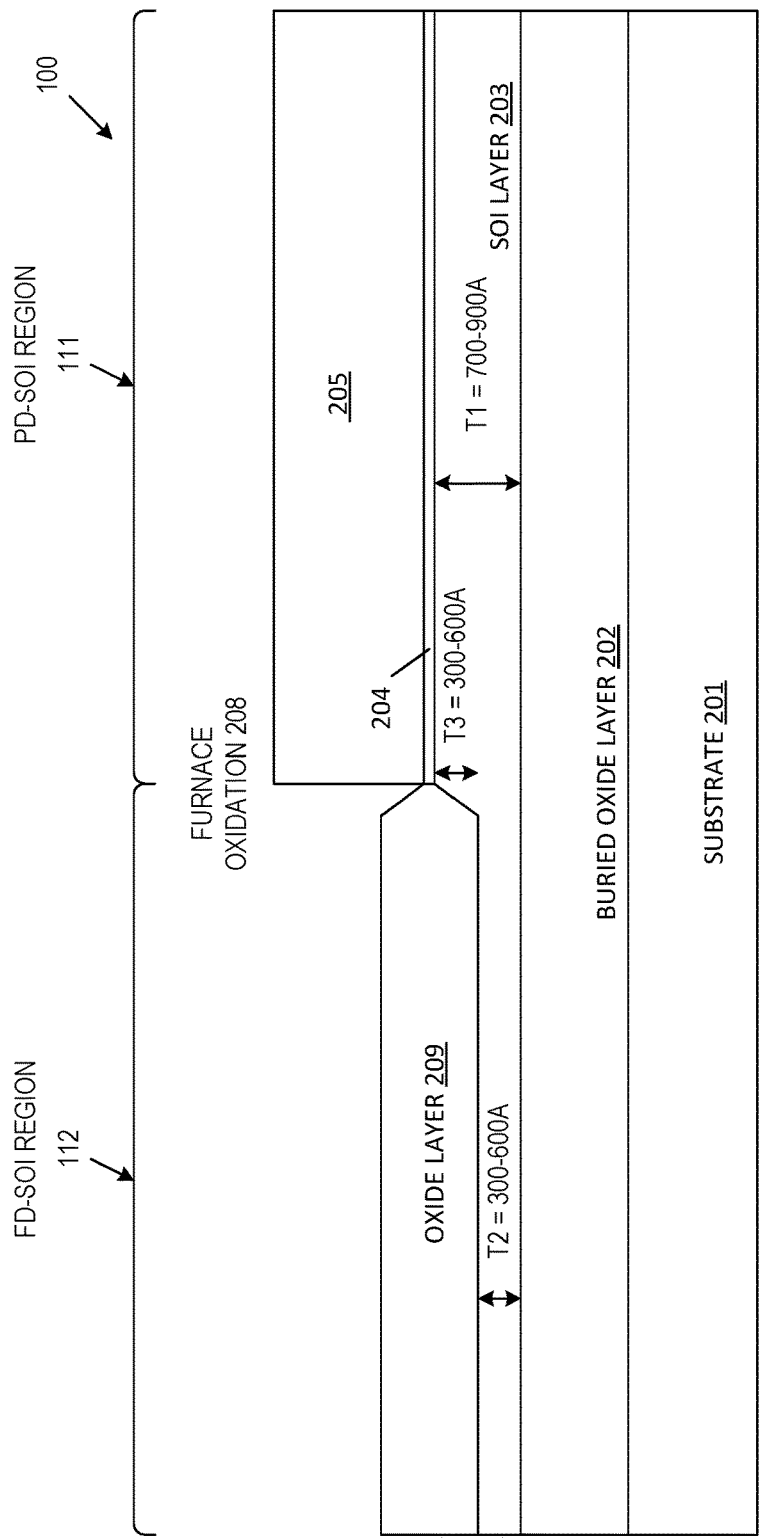

As illustrated in FIG. 2D, the first mask 206 is removed, and a furnace oxidation step 208 is performed, thereby growing an oxide layer 209 on the exposed portions of SOI layer 203. In one embodiment, the growth of oxide layer 209 is controlled to consume a thickness T3 of about 300 to 600 Angstroms of SOI layer 203. As a result, the remaining thickness T2 of the SOI layer 203 in FD-SOI region 112 is about 300 to 600 Angstroms. The thickness T2 is selected to correspond with the appropriate silicon thickness for the fabrication of a FD-SOI transistor.

Figure 2E:
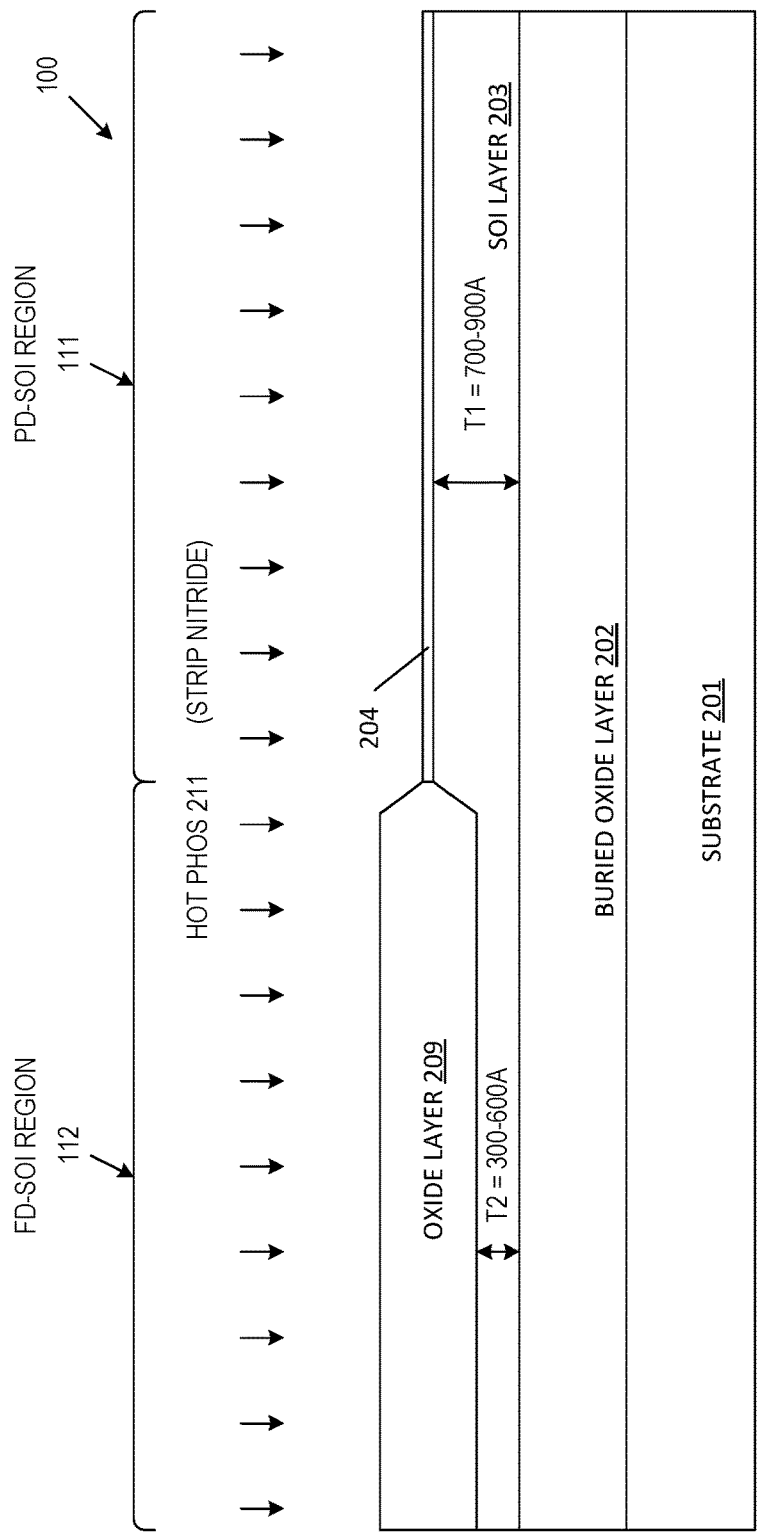

As illustrated in FIG. 2E, the remaining portions of silicon nitride layer 205 are stripped using a hot phosphoric acid etch 211. In one embodiment, the hot phosphoric acid etch 211 is performed by immersing the wafer in a bath of phosphoric acid at a temperature of about 165 degrees Celsius for about 1 hour.

Figure 2F:
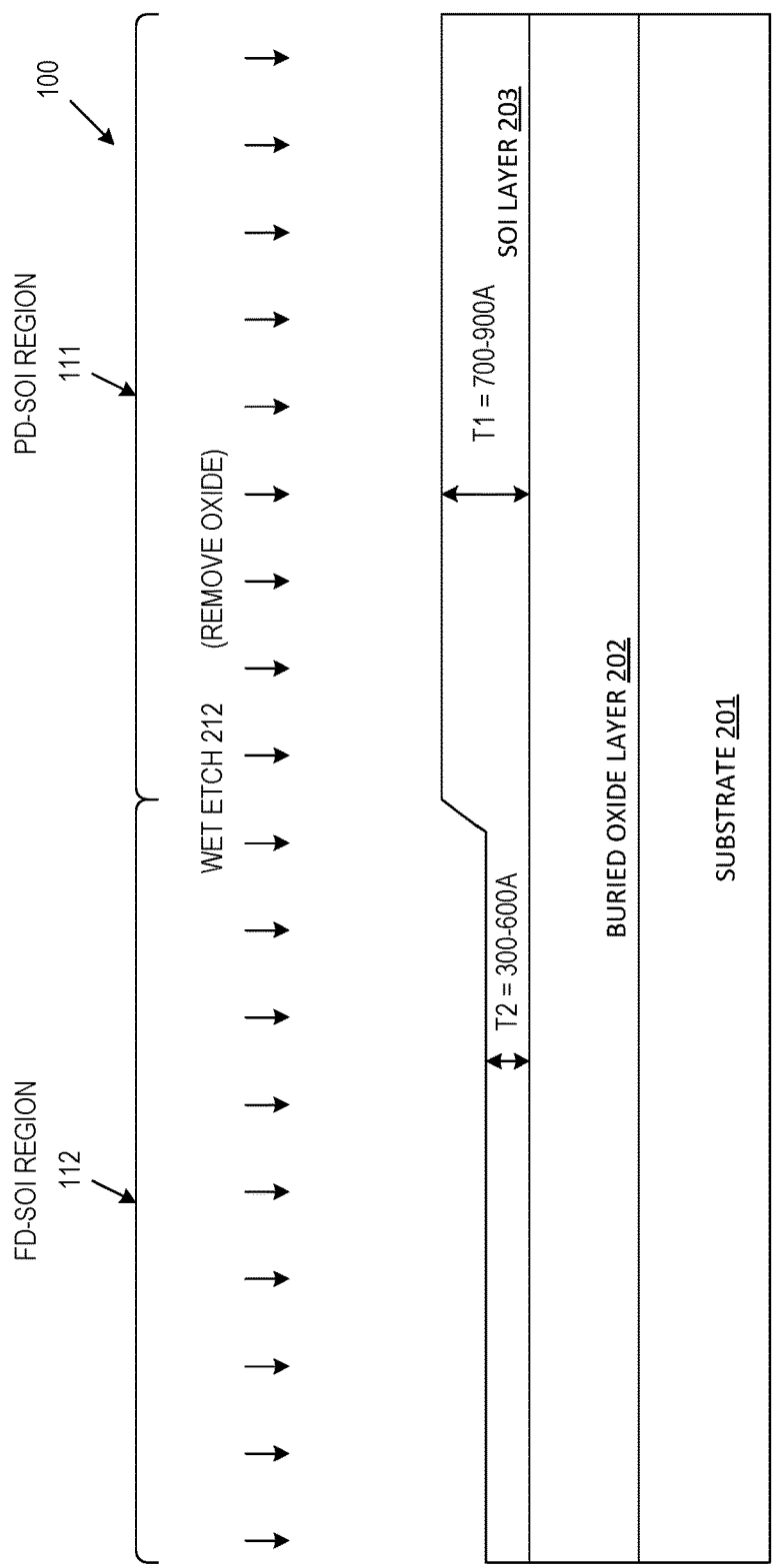

As illustrated in FIG. 2F, a wet etch step 212 is performed to remove the thin oxide layer 204 and the oxide layer 209, thereby exposing the underlying SOI layer 203. In one embodiment, the wet etch step 212 is performed by immersing the wafer in a bath of 5% diluted hydrofluoric acid for about 10 minutes.

Figure 2G:
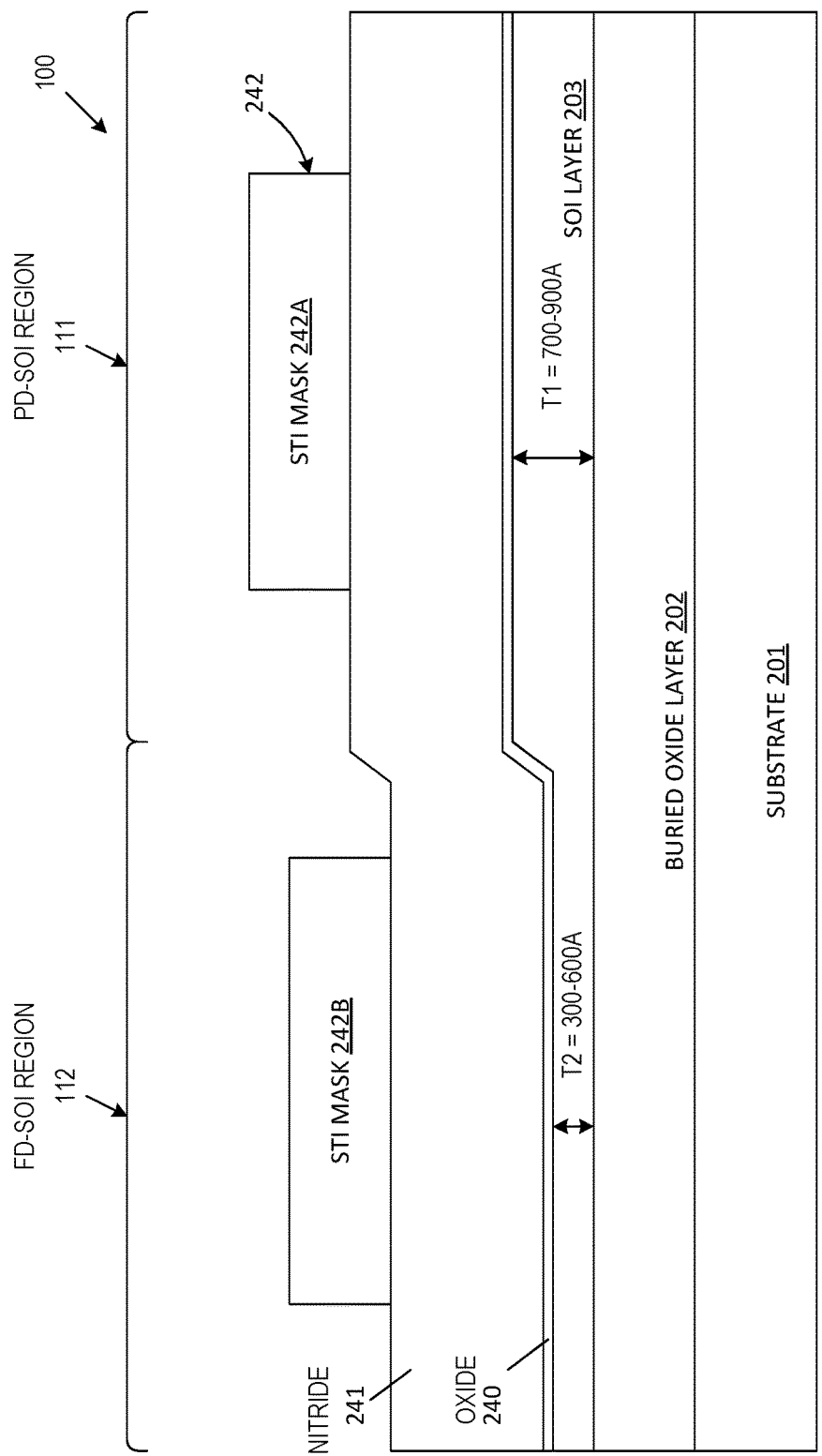

As illustrated in FIG. 2G, a thin silicon oxide layer 240 having a thickness of about 100 Angstroms is formed over the exposed SOI layer 203, and a silicon nitride layer 241 having a thickness of about 1500 Angstroms is formed over the thin silicon oxide layer 240. A shallow trench isolation (STI) mask 242, which includes STI mask portions 242A and 242B, is formed over nitride layer 241. The openings in STI mask 242 define the locations where STI regions will be subsequently formed.

Figure 2H:
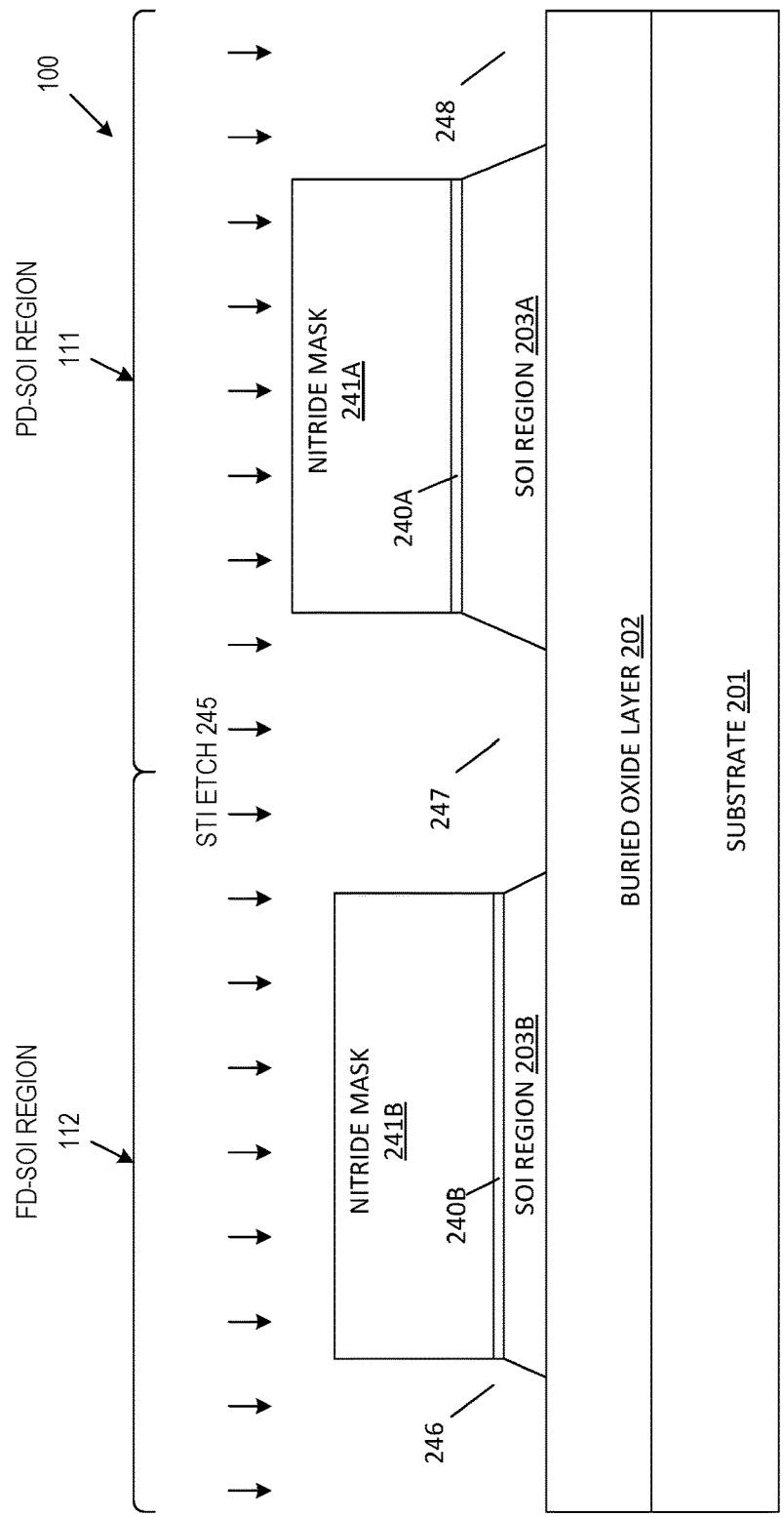

As illustrated by FIG. 2H, nitride layer 241 is etched through STI mask 242, thereby forming a nitride hard mask that includes silicon nitride regions 241A-241B. The STI mask 242 is then stripped. The portions of thin oxide layer 240 exposed through the silicon nitride regions 241A-241B are etched, thereby leaving thin oxide regions 240A-240B under nitride mask regions 241A-241B, respectively. At this time, portions of the underlying SOI layer 203 are exposed. An STI etch 245 is then performed, removing the exposed portions of the underlying SOI layer 203 to form STI region trenches 246-248. Note that the STI etch 245 stops on the underlying buried oxide layer 202, thereby forming separate SOI regions 203A and 203B in PD-SOI region 111 and FD-SOI region 112, respectively.

Figure 2I:
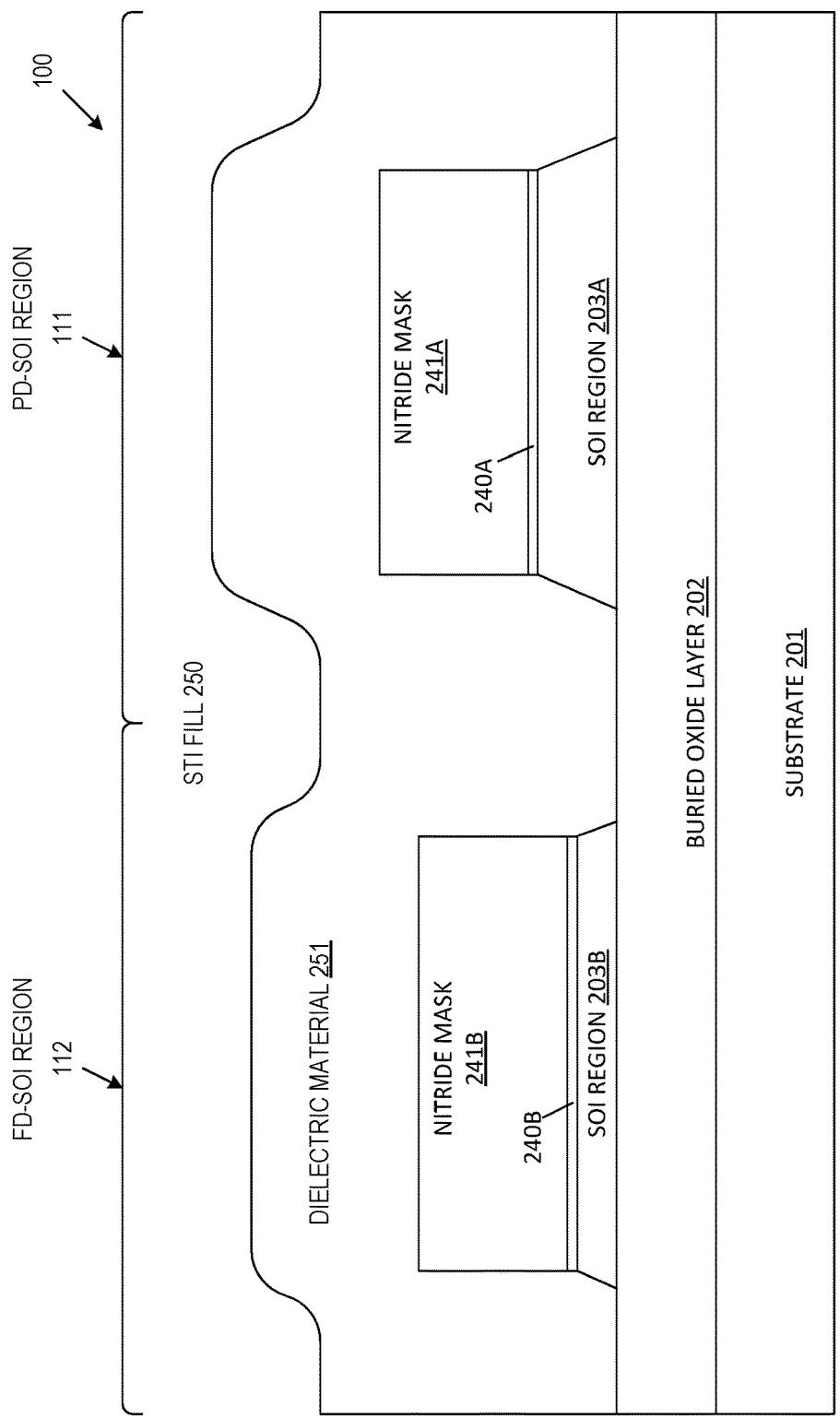

As illustrated in FIG. 2I, an STI fill step 250 is performed, wherein dielectric material 251 is deposited over the structure of FIG. 2H. Dielectric material 251 fills the STI region trenches 246-248 between the SOI regions 203A and 203B. In one embodiment, dielectric material 251 is silicon oxide, deposited to a thickness of about 3000 Angstroms.

Figure 2J:
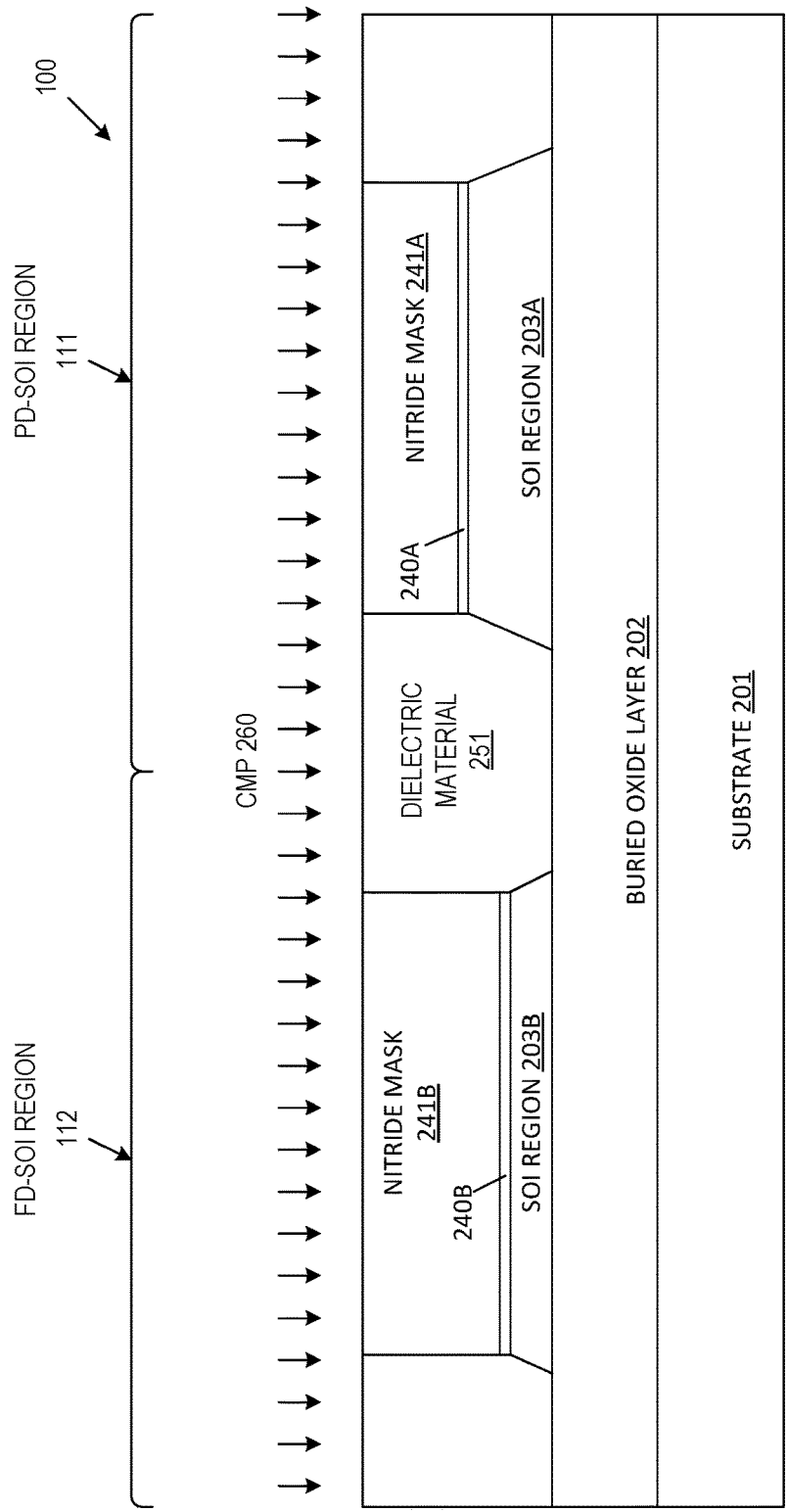

As illustrated in FIG. 2J, a chemical-mechanical polishing (CMP) step 260 is then performed. This CMP step 260 exposes the nitride mask portions 241A-241B, and planarizes the upper surface of the resulting structure.

Figure 2K:
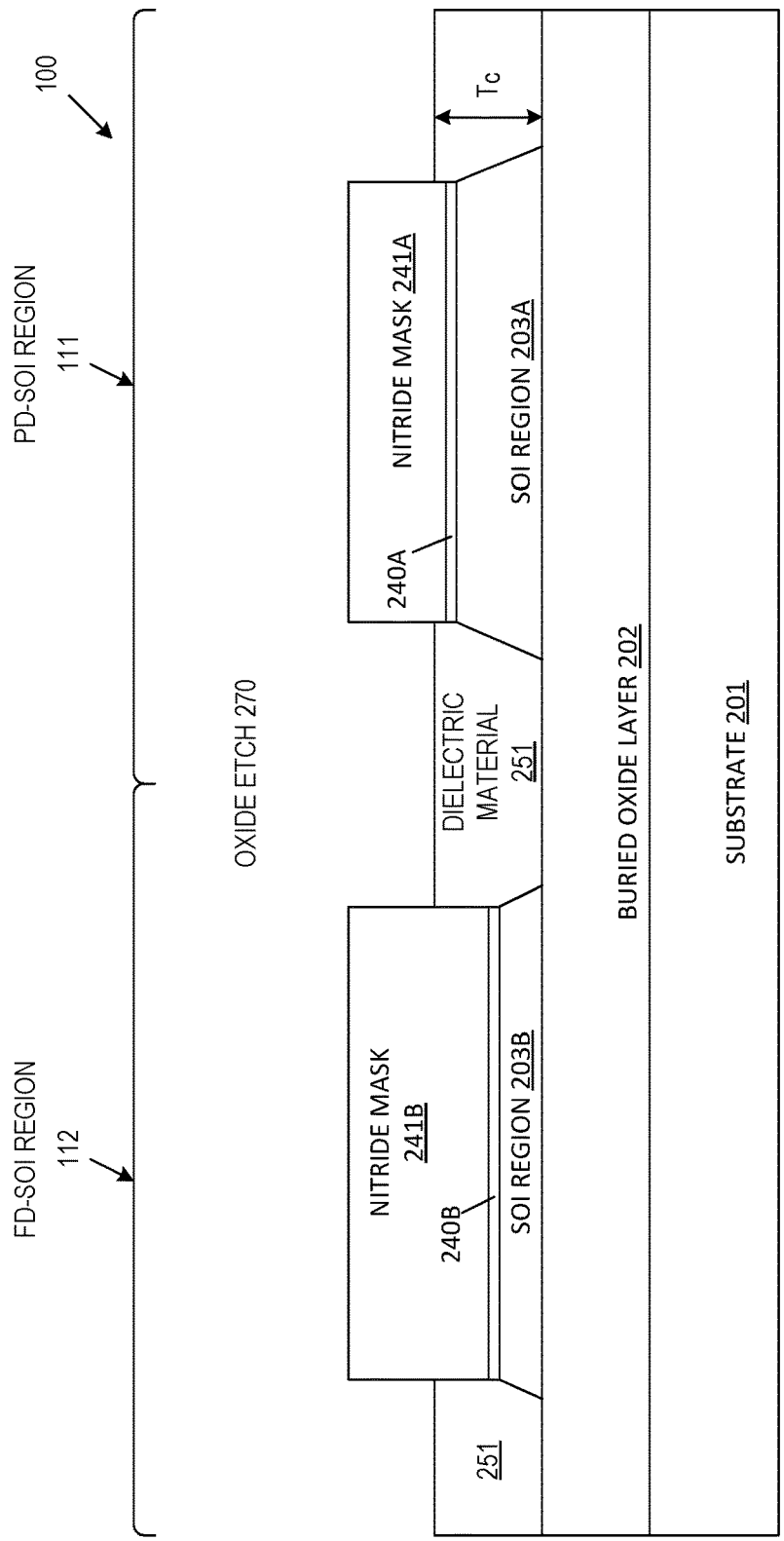

As illustrated in FIG. 2K, an oxide etch step 270 is performed, wherein about 300 Angstroms of the dielectric material 251 is removed, such that the remaining portions of the dielectric material 251 have a thickness $T_C$ of about 1000 Angstroms. In the illustrated embodiment, the thickness $T_C$ is selected to be greater than the thickness T1 of SOI region 203A. In one embodiment, the oxide etch step 270 is performed by immersing the wafer in a 40:1 buffered hydrofluoric acid bath for about 1 minute.

Figure 2L:
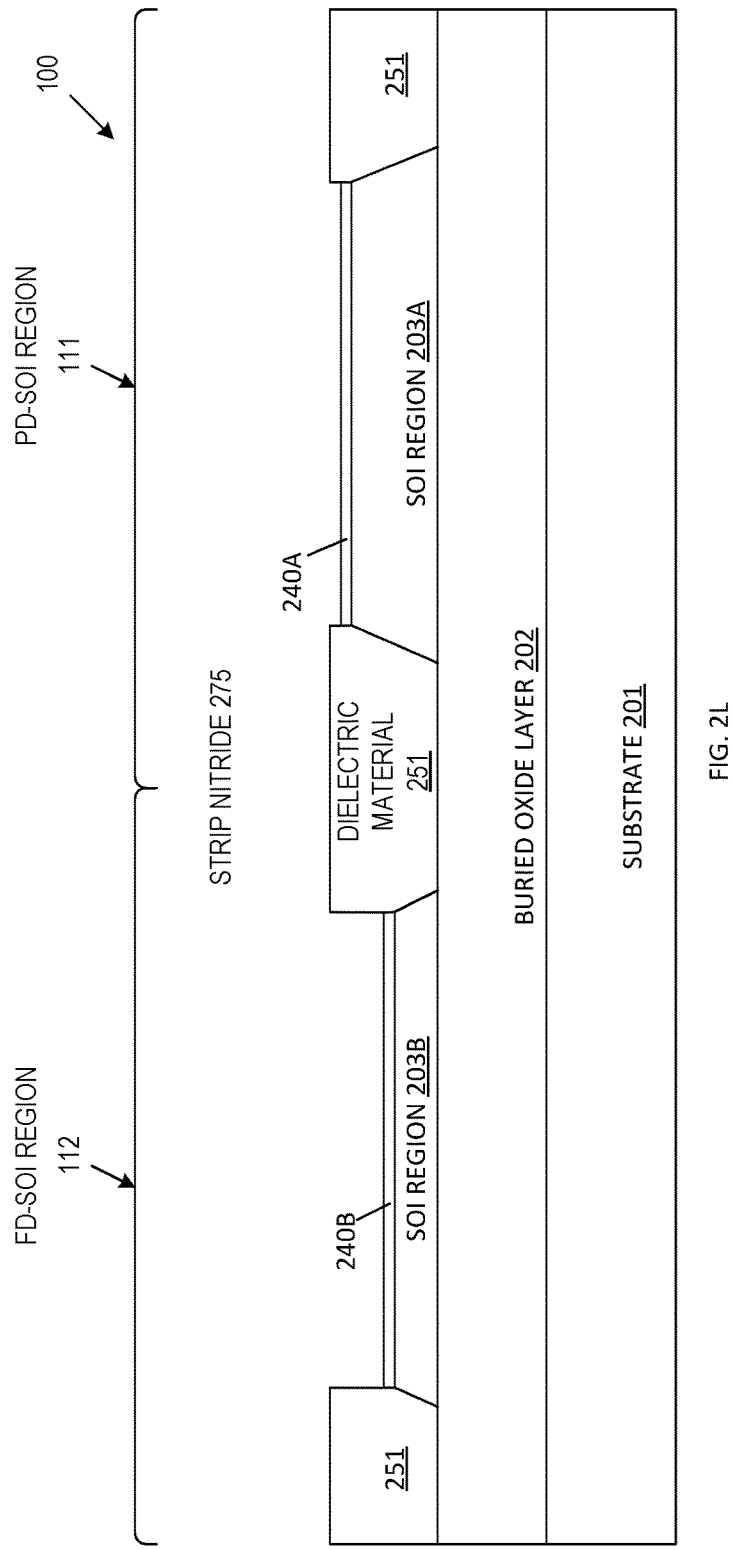

As illustrated in FIG. 2L, a nitride strip step 275 is performed, wherein the nitride mask regions 241A-241B are removed. In one embodiment, nitride regions 241A-241B are removed by immersing the wafer in a bath of phosphoric acid at a temperature of about 165 degrees Celsius for about 1 hour.

Figure 2M:
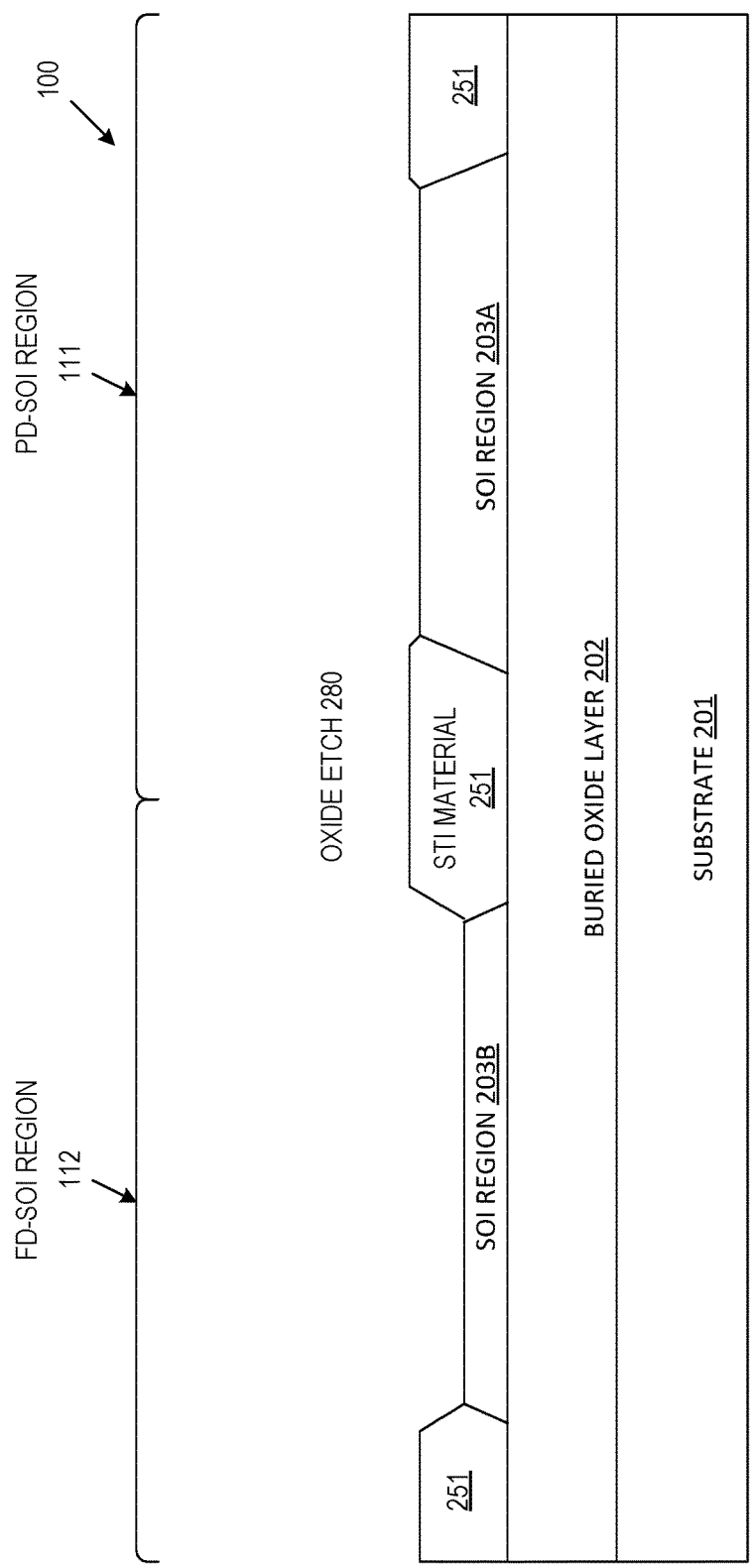

As illustrated by FIG. 2M, an oxide etch 280 is performed, thereby removing the thin oxide regions 240A-240B and exposing the upper surfaces of SOI regions 203A-203B for further processing. PD-SOI transistor 101 is fabricated in SOI region 203A, and FD-SOI transistor 102 is concurrently fabricated in SOI region 203B using conventional SOI CMOS processing steps, thereby resulting in the SOI structure 100 illustrated in FIG. 1. In accordance with one embodiment, PD-SOI transistor 101 and FD-SOI transistor 102 have the same channel conductivity type (e.g., channel regions 123 and 143 are both p-type channel regions). In this embodiment, the LDD regions 121A-122A and 141A-142A of transistors 101 and 102 are formed by a common LDD implant (e.g., an n− type implant), and the source/drain contact regions 121B-122B and 141B-142B of transistors 101 and 102 are formed by a common source/drain implant (e.g., an n+ type implant). Using common implants to form the source/drain regions of both PD-SOI transistor 101 and FD-SOI transistor 102 advantageously simplifies the process required to fabricate SOI structure 100, reducing the manufacturing cost. Although the source/drain regions 121B-122B do not extend to the bottom of SOI region 203A in the embodiment illustrated by FIG. 1, it is understood that in other embodiments, these source/drain regions 121B-122B may extend to the bottom of SOI region 203A (while maintaining the desirable operating characteristics of PD-SOI transistor 101).

Note that the greater thickness T1 of SOI region 203A causes the resulting transistor 101 to operate as a partially depleted transistor, at least in part because during high on-state gate bias, the depletion region under gate region 125 does not extend to the bottom of the SOI region 203A. In contrast, the smaller thickness T2 of SOI region 203B causes the resulting transistor 102 to operate as a fully depleted transistor, at least in part because the depletion region under gate region 145 extends to the bottom of SOI region 203B.

FIGS. 3A-3K are cross sectional views that illustrate various process steps used to fabricate a SOI structure 300

(which is similar to SOI structure 100), in accordance with an alternate embodiment of the present invention.

Figure 3A:
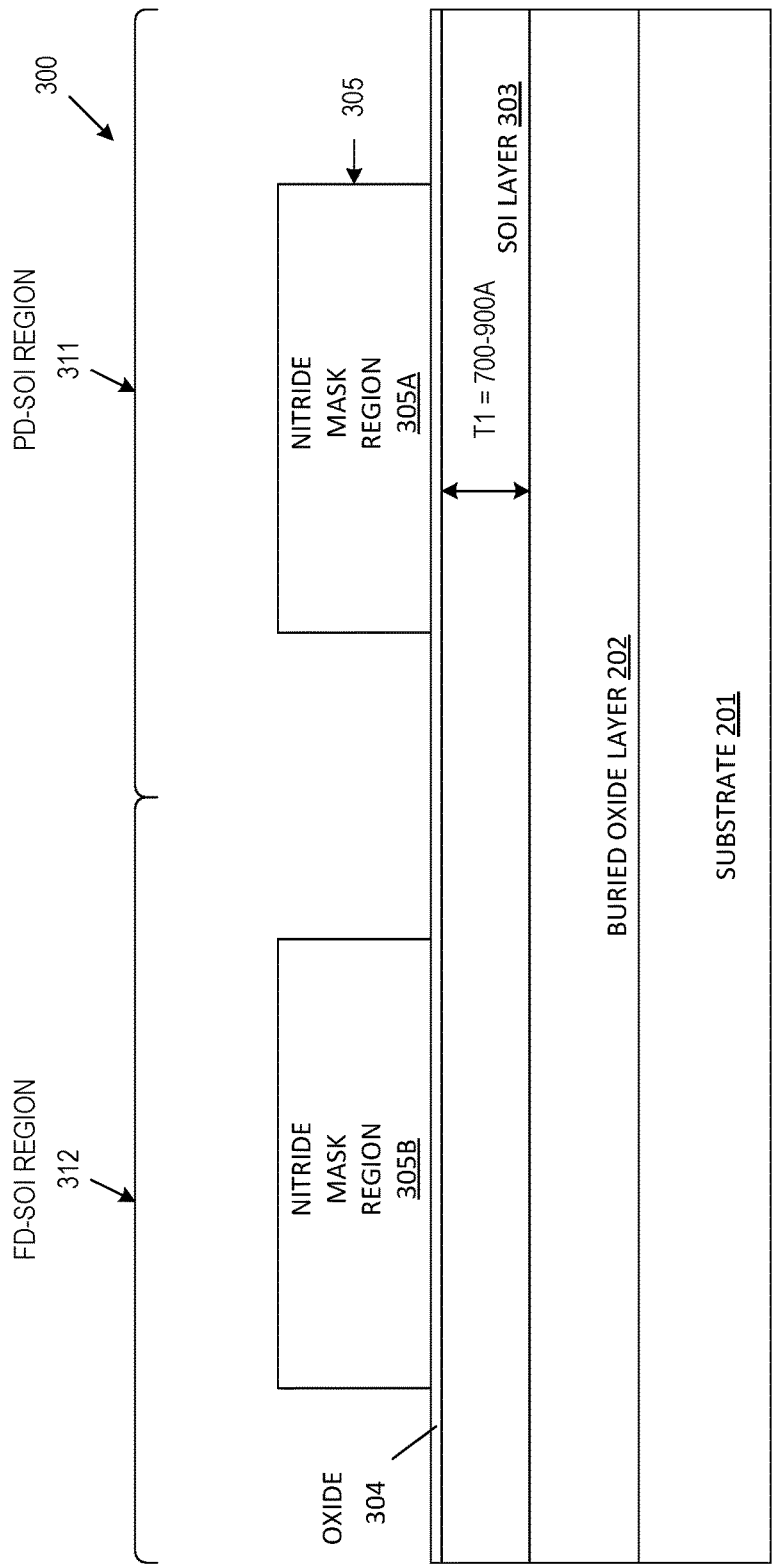

As illustrated by FIG. 3A, SOI structure 300 includes high-resistance substrate 201 and buried oxide layer 202, which have been described above in connection with SOI structure 100. SOI layer 303, which is similar to SOI layer 203, is located over buried oxide layer 202. In the illustrated embodiment, SOI layer is monocrystalline silicon having a thickness $T_1$ of about 700-900 Angstroms. SOI structure 300 is divided into PD-SOI region 311 (where PD-SOI devices are fabricated) and FD-SOI region 312 (where FD-SOI devices are fabricated).

A thin silicon oxide layer 304 having a thickness of about 100 Angstroms is grown over the upper surface of SOI layer 303. A silicon nitride layer is deposited over oxide layer 304. This silicon nitride layer is patterned to form silicon nitride mask 305, which includes nitride mask regions 305A-305B.

Figure 3B:
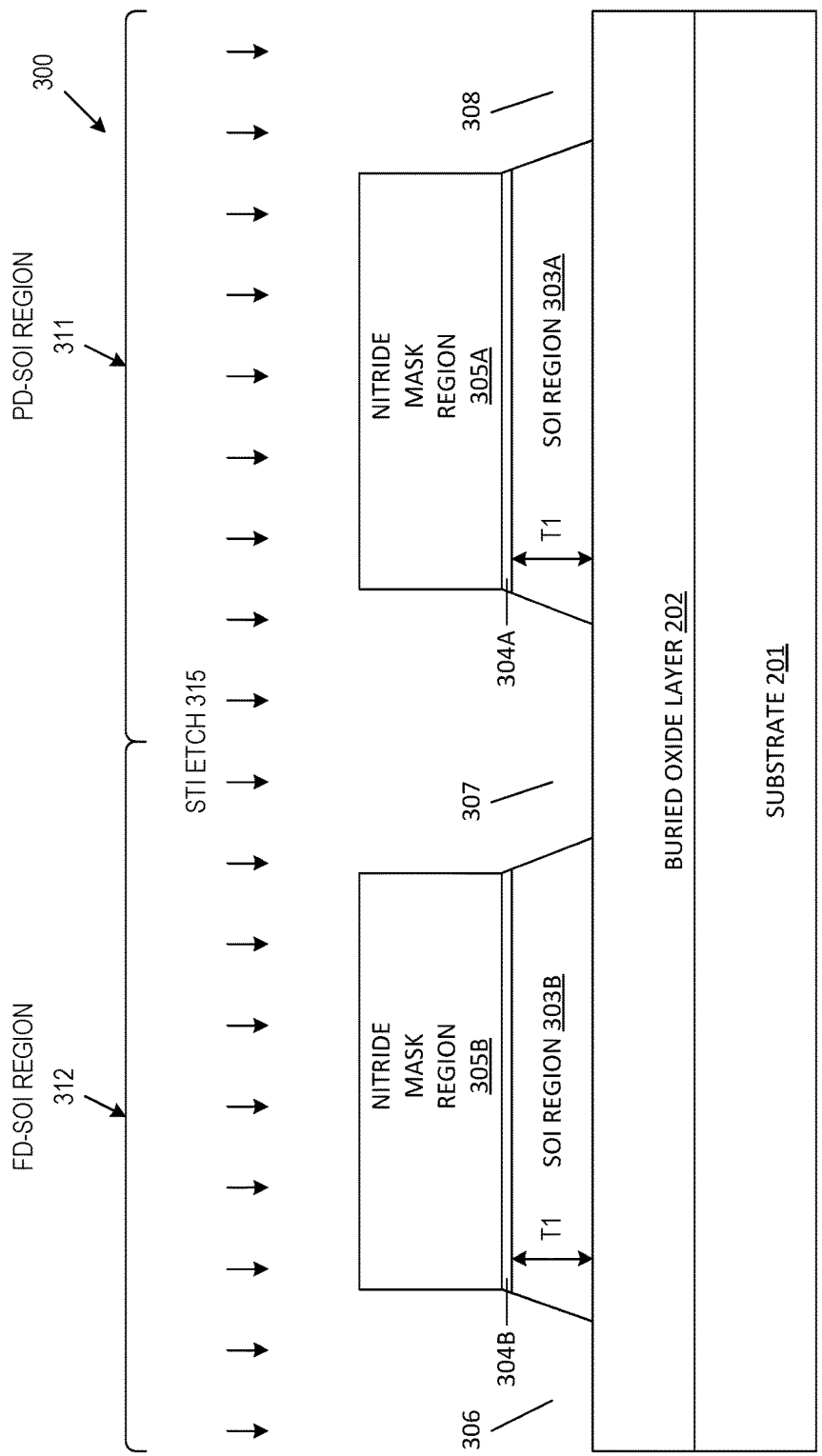

As illustrated by FIG. 3B, a series of STI etch steps 315 are performed, wherein the portions of thin oxide layer 304 exposed through nitride mask regions 305A-305B are etched, thereby leaving thin oxide regions 304A-304B under nitride mask regions 305A-305B, respectively. At this time, portions of the underlying SOI layer 303 are exposed. A main STI etch is then performed, removing the exposed portions of the underlying SOI layer 303 to form STI region trenches 306-308. Note that the main STI etch stops on the underlying buried oxide layer 202, thereby forming separate SOI regions 303A and 303B in PD-SOI region 311 and FD-SOI region 312, respectively.

Figure 3C:
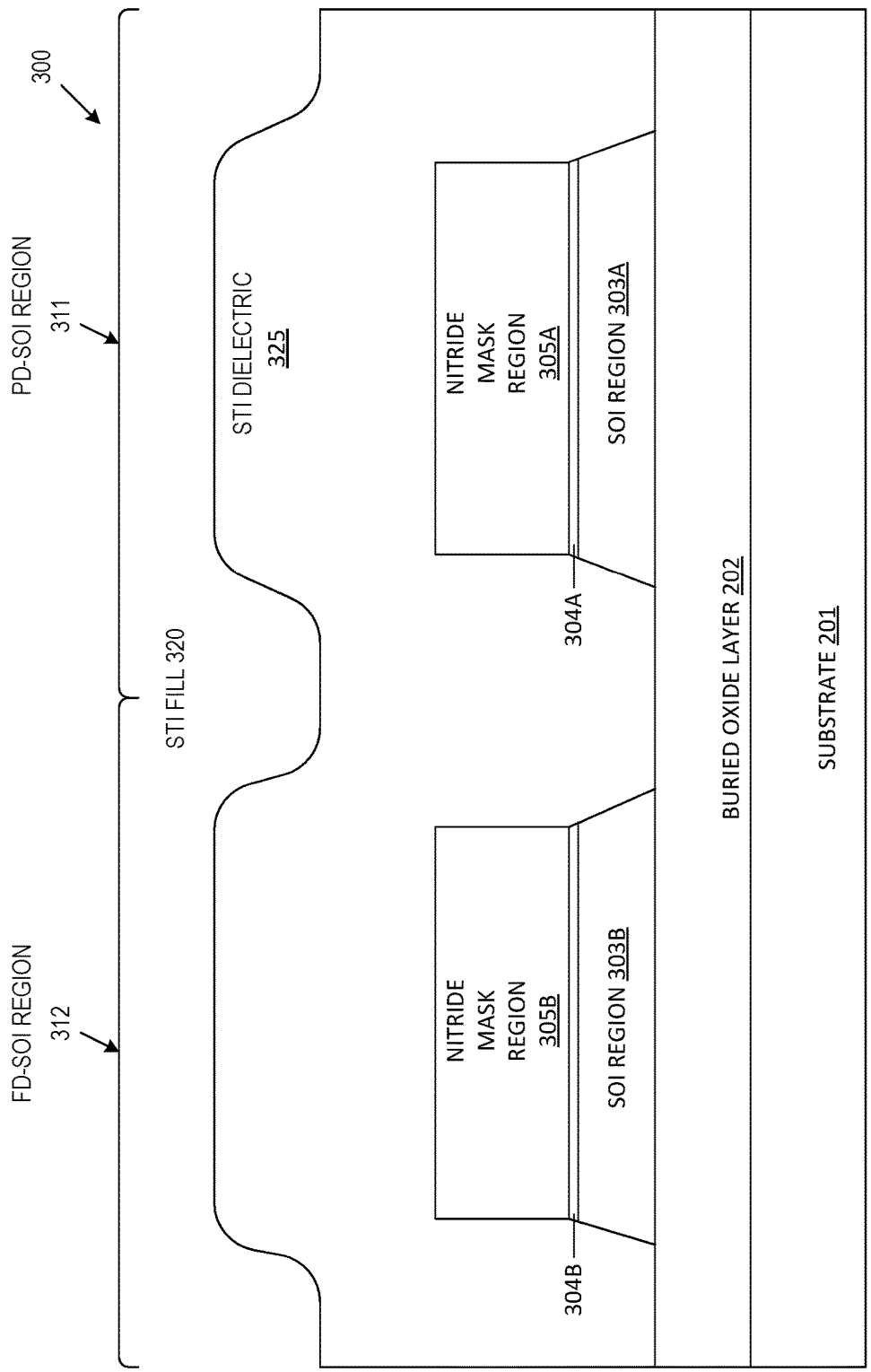

As illustrated in FIG. 3C, an STI fill step 320 is performed, wherein dielectric material 325 is deposited over the structure of FIG. 3B. Dielectric material 325 fills the STI region trenches 306-308 between SOI regions 303A and 303B. In one embodiment, dielectric material 325 is silicon oxide, deposited to a thickness of about 3000 Angstroms.

Figure 3D:
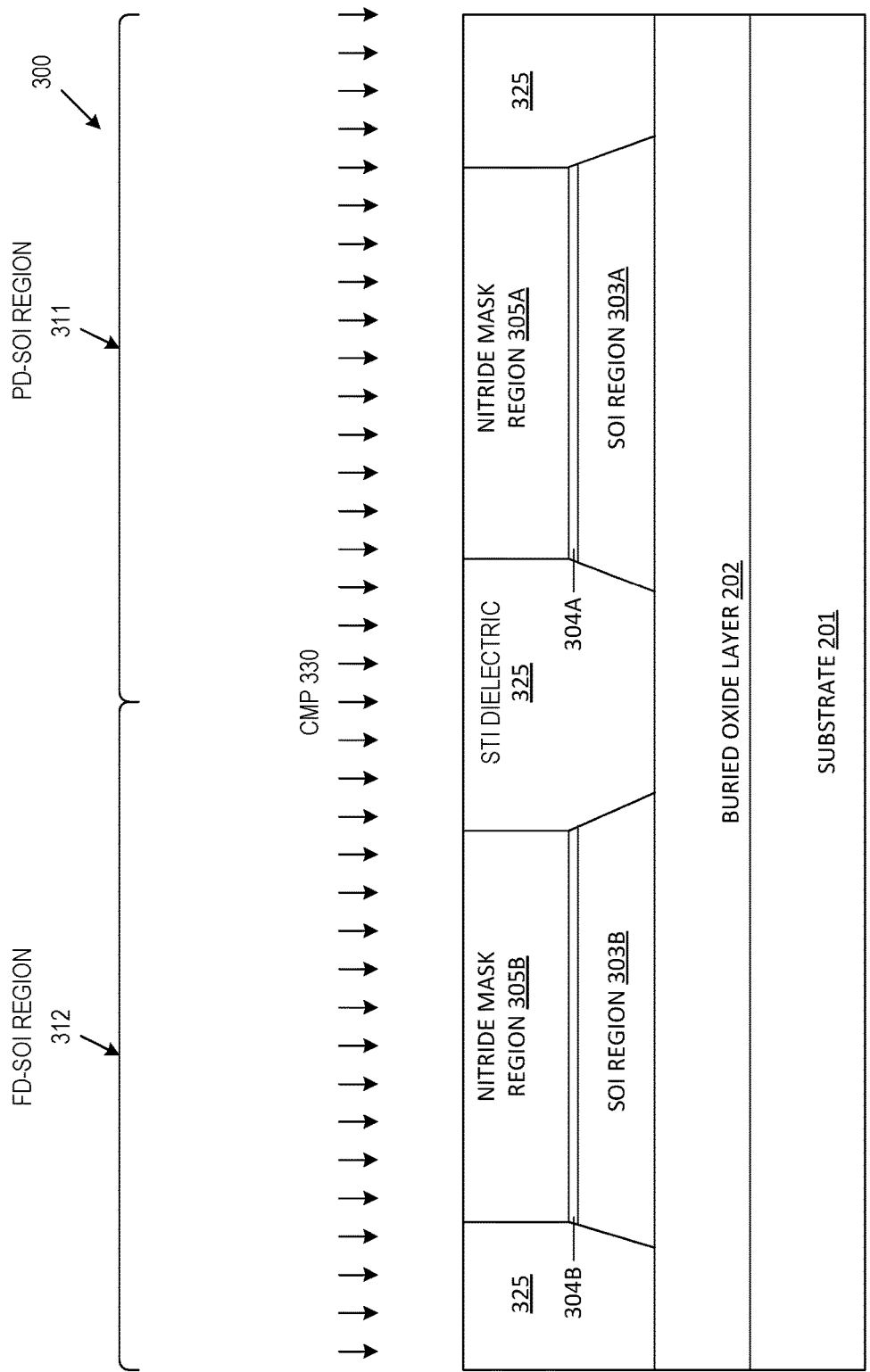

As illustrated in FIG. 3D, a chemical-mechanical polishing (CMP) process 330 is then performed. This CMP step 330 exposes the nitride mask portions 305A-305B, and planarizes the upper surface of the resulting structure.

Figure 3E:
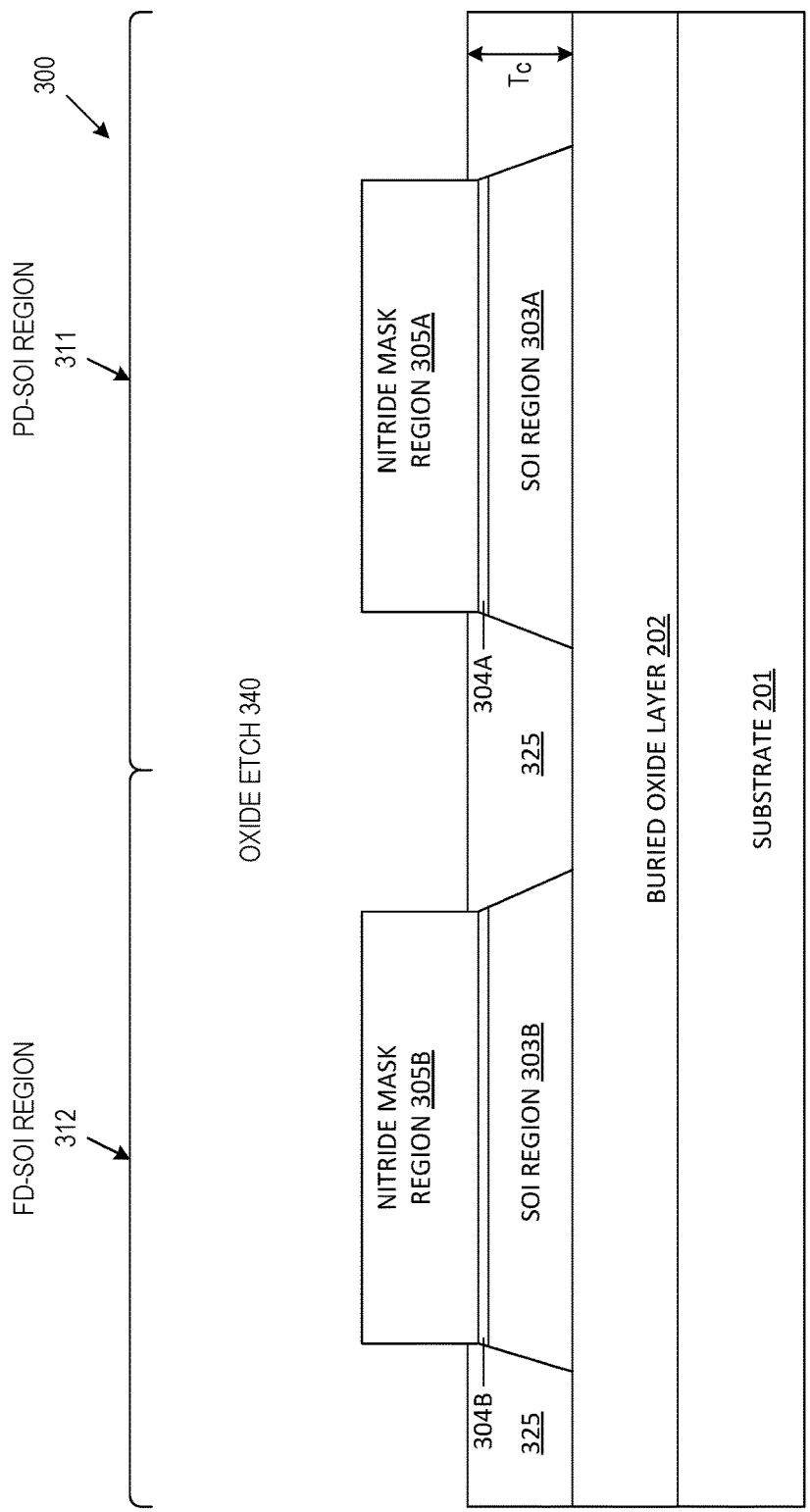

As illustrated in FIG. 3E, an oxide etch step 340 is performed, wherein about 300 Angstroms of the dielectric material 325 is removed, such that the remaining portions of the dielectric material 325 have a thickness $T_c$ of about 1000 Angstroms. In the illustrated embodiment, the thickness $T_c$ is selected to be greater than the thickness T1 of SOI regions 303A and 303B. In one embodiment, the oxide etch step 340 is performed by immersing the wafer in a 40:1 buffered hydrofluoric acid bath for about 1 minute.

As illustrated in FIG. 3F, a nitride strip step 345 is performed, wherein the nitride mask regions 305A-305B are removed. In one embodiment, nitride regions 305A-305B are removed by immersing the wafer in a bath of phosphoric acid at a temperature of about 165 degrees Celsius for about 1 hour.

Figure 3G:
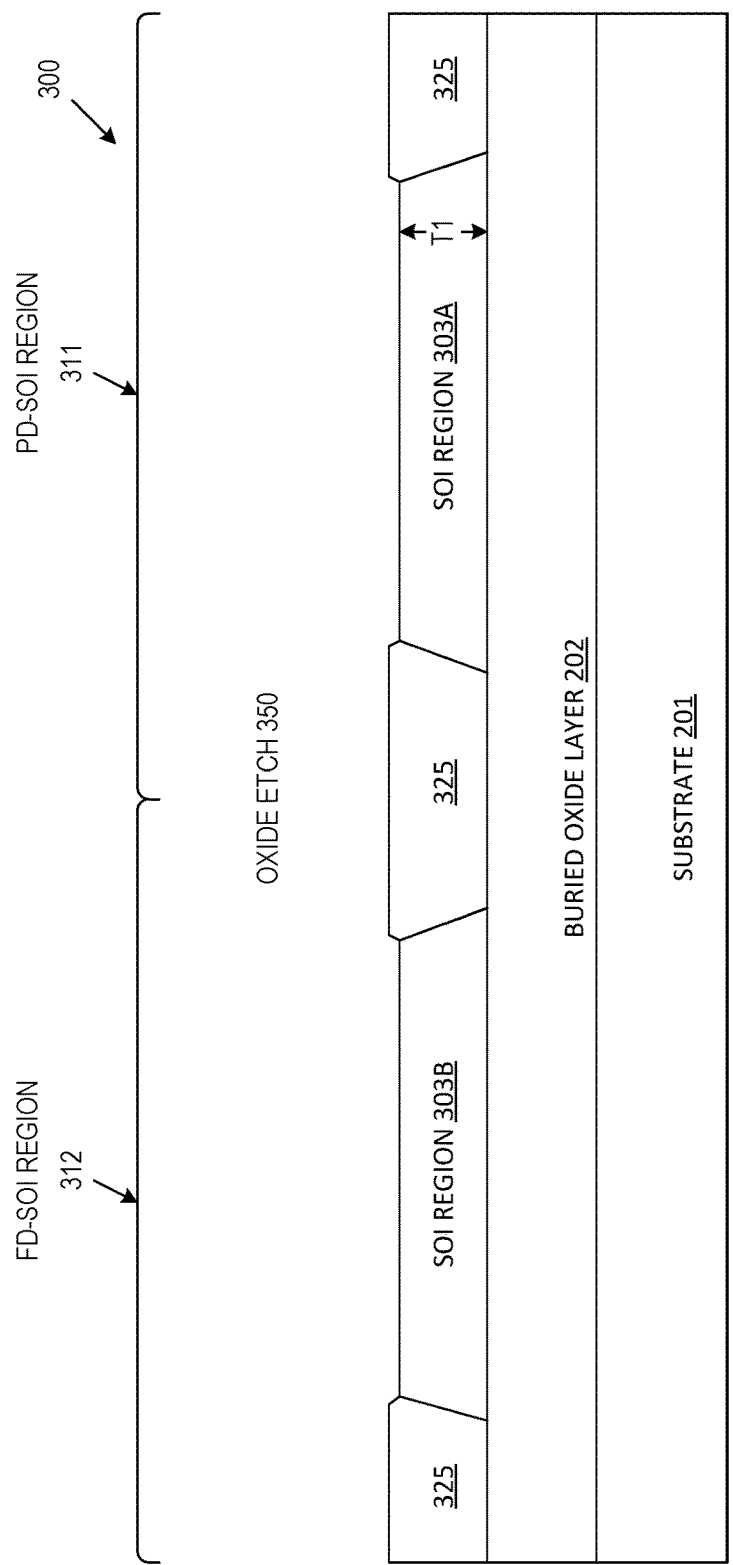

As illustrated by FIG. 3G, an oxide etch 350 is performed, thereby removing the thin oxide regions 304A-304B and exposing the upper surfaces of SOI regions 303A-303B for further processing. Note that SOI regions 303A and 303B still have a thickness T1 of about 700 to 900 Angstroms at the end of the oxide etch step 350. Also note that the oxide etch step 350 leaves STI regions 325, which laterally surround and isolate SOI regions 303A-303B.

Figure 3H:
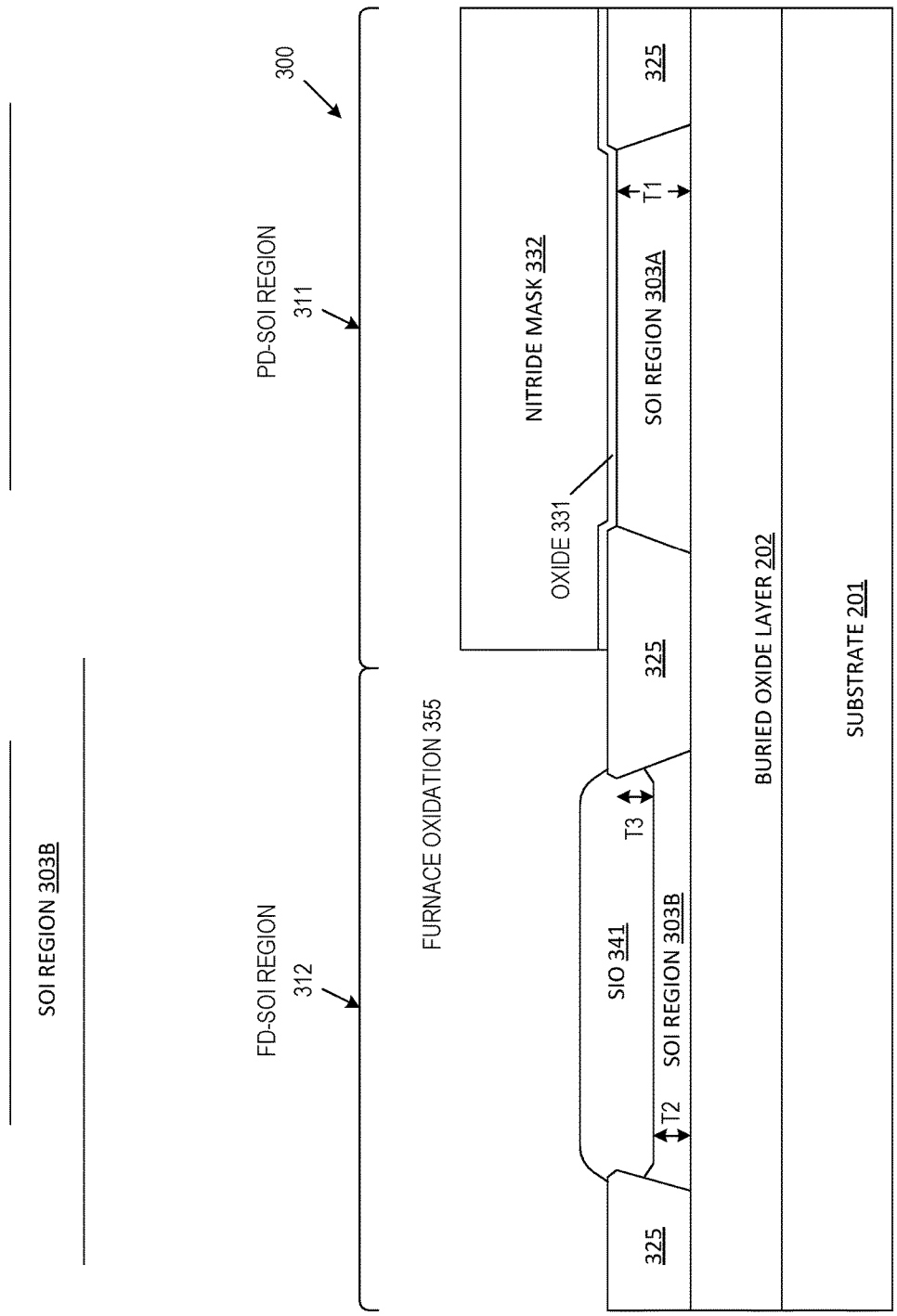

As illustrated by FIG. 3H, a thin silicon oxide layer (having a thickness of about 100 to 150 Angstroms) is grown and a silicon nitride layer (having a thickness of about 1500 Angstroms) is then deposited over the entire SOI structure of FIG. 3G. These layers are patterned to form silicon oxide region 331 and an overlying nitride mask 332, which cover the SOI region 303A within PD-SOI region 311. After the oxide region 331 and nitride mask 332 have been formed, a furnace oxidation process 355 is implemented, thereby oxidizing the exposed upper surface of SOI region 303B in the FD-SOI region 312. The furnace oxidation process 355 is controlled to grow a silicon oxide layer 341 having a thickness sufficient to consume a thickness T3 of about 300 to 600 Angstroms of the exposed SOI region 303B, such that the remaining thickness T2 of the SOI region 303B is about 300 to 600 Angstroms. In one embodiment, silicon oxide layer 341 is grown to a thickness in a range of about 700 to 1400 Angstroms.

Figure 3I:
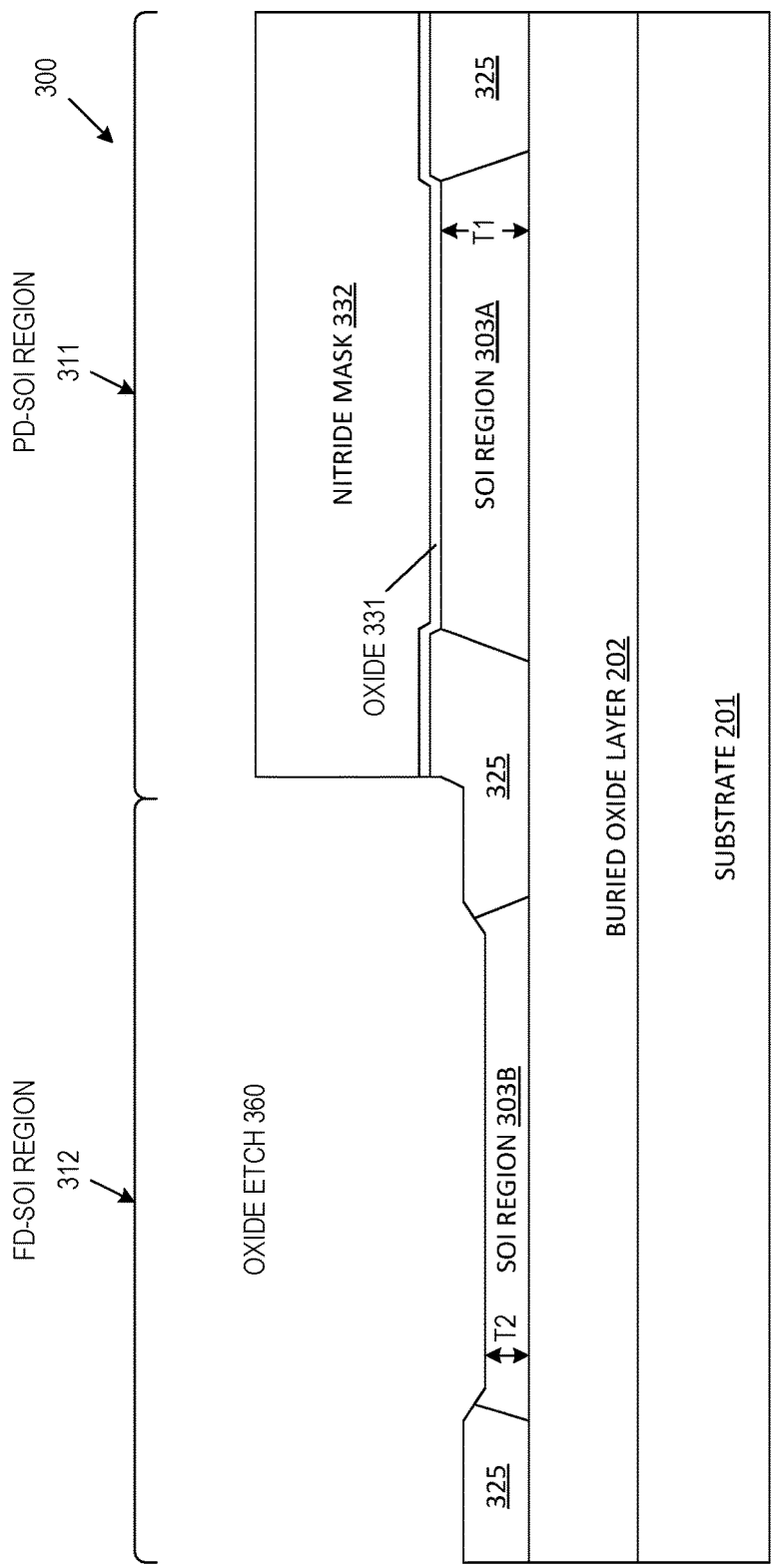

As illustrated by FIG. 3I, an oxide etch process 360 is performed to remove the silicon oxide layer 341, thereby exposing the upper surface of the thinned SOI region 303B. In the illustrated embodiment, exposed upper portions of STI regions 325 are removed during the oxide etch process 360.

Figure 3J:
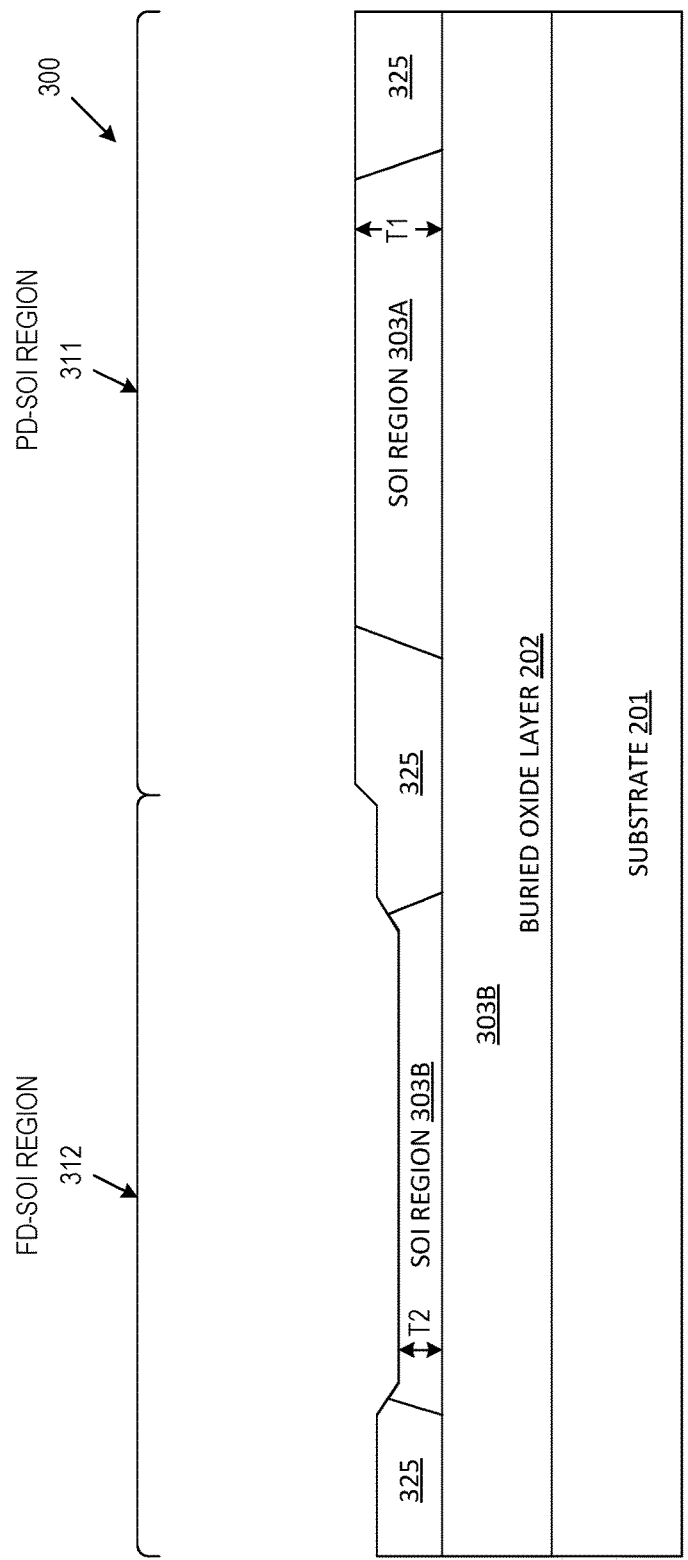

As illustrated by FIG. 3J, nitride mask 332 is removed using a hot phosphoric acid etch. Oxide region 331 is then removed by an oxide etch. At this time, the upper surfaces of SOI regions 303A-303B are exposed for further processing.

Figure 3K:
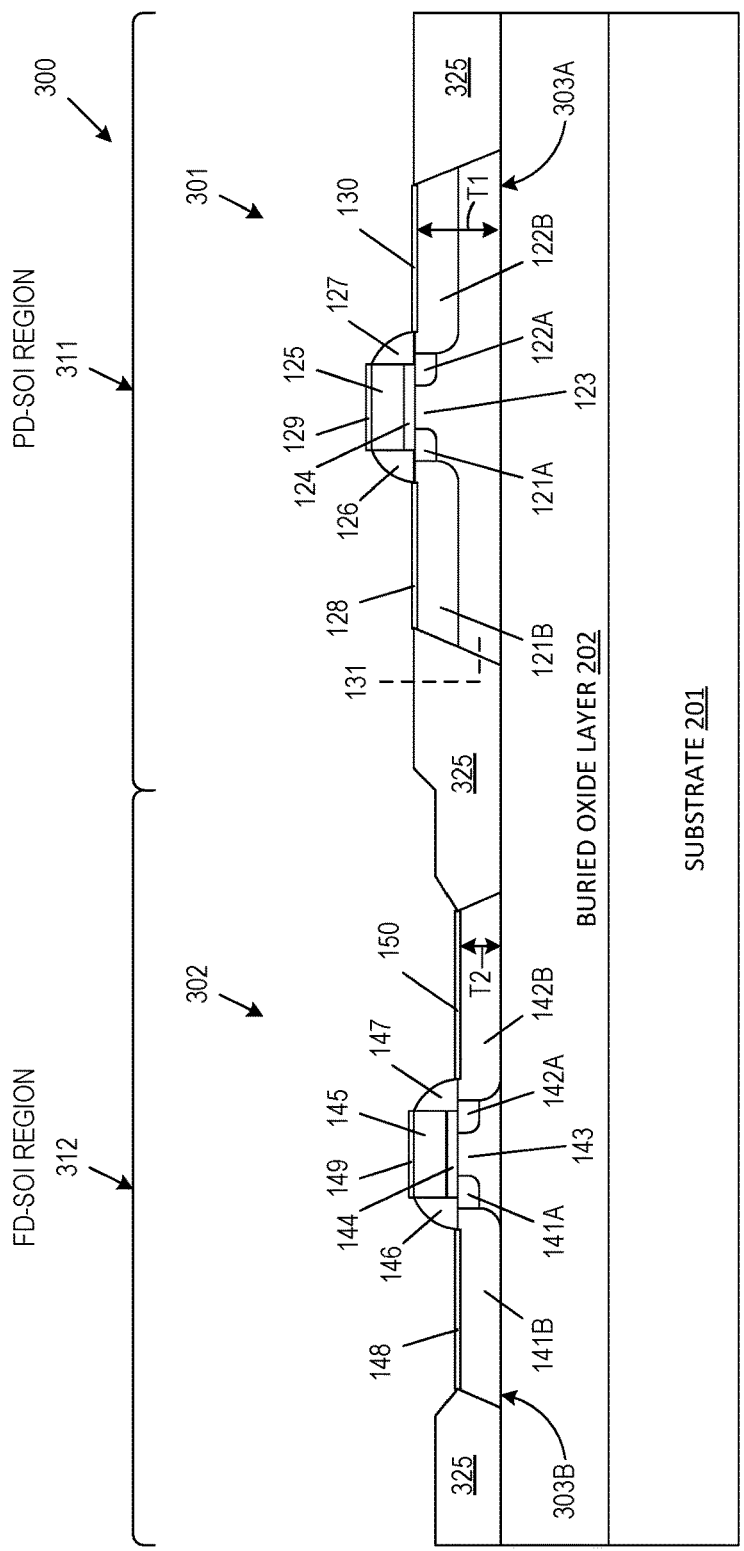

As illustrated in FIG. 3K, PD-SOI transistor 301 is fabricated in SOI region 303A, and FD-SOI transistor 302 is concurrently fabricated in SOI region 303B using conventional SOI CMOS processing steps. Note that similar elements of PD-SOI transistors 301 and 101 (FIG. 1) are labeled with similar reference numbers, and similar elements of FD-SOI transistors 302 and 102 (FIG. 1) are labeled with similar reference numbers. Note that PD-SOI transistor 301 and FD-SOI transistor 302 exhibit the same advantages as PD-SOI transistor 101 and FD-SOI transistor 102, as described above.

Figure 4:
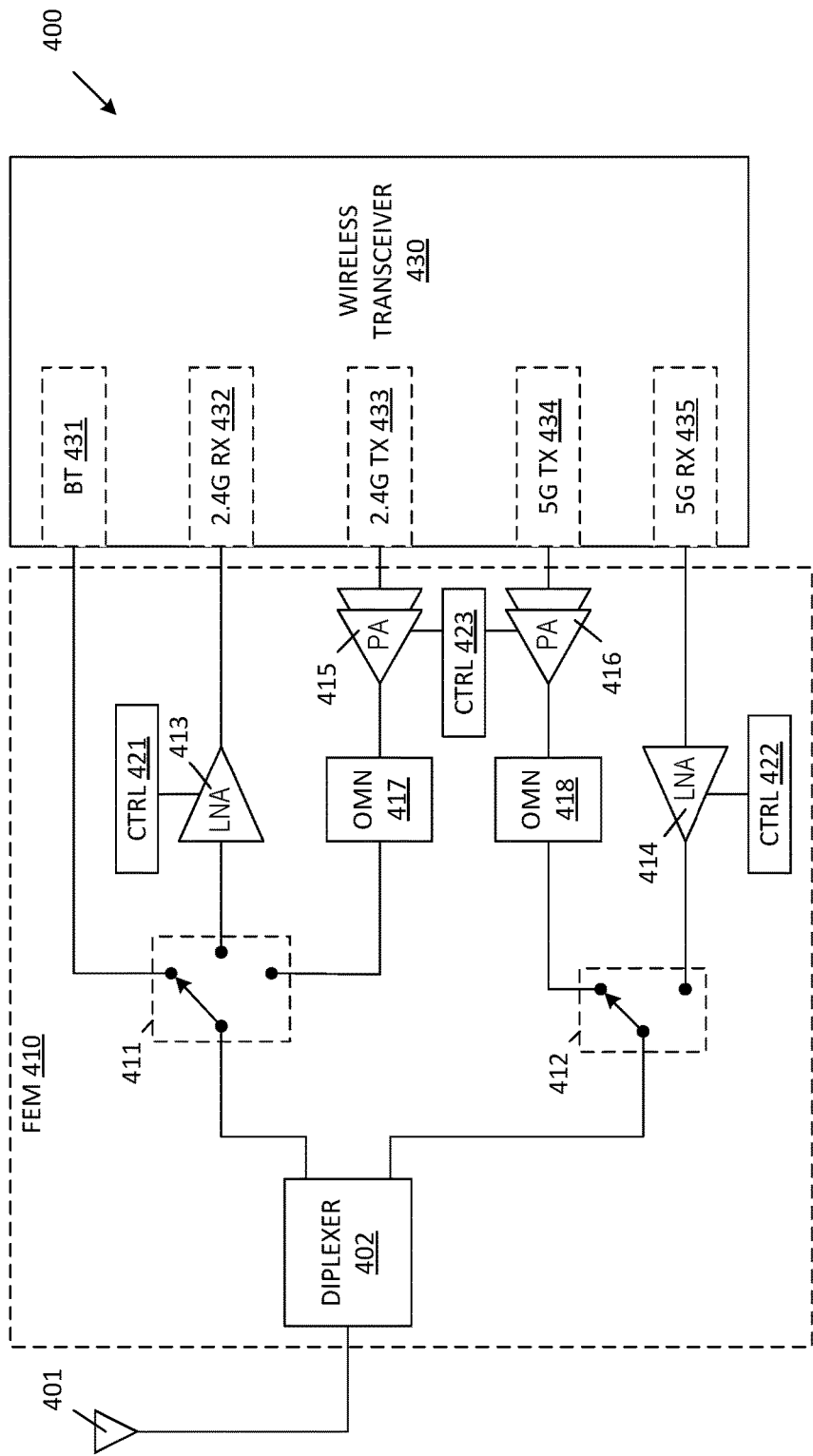
FIG. 4 is a block diagram of a dual-band wireless communication device that includes RF switch circuits that implement FD-SOI transistors of the present invention, and bias/control circuits that implement PD-SOI transistors of the present invention.

FIG. 4 is a block diagram of a dual-band wireless communication device 400 that includes antenna 401, front end module (FEM) 410 and wireless transceiver 430. Front end module 410 includes diplexer 402, radio frequency (RF) switch circuits 411-412, low-noise amplifiers (LNAs) 413-414, power amplifiers 415-416, output impedance matching networks (OMNs) 417-418 and bias/control circuits 421-423. Wireless transceiver 430 includes a Bluetooth port 431, 2.4 GHz receive port 432, a 2.4 GHz transmit port 433, a 5 GHz transmit port 434 and a 5 GHz receive port 435. RF switch circuit 411 includes a first RF switch that couples antenna 401 to Bluetooth port 431, a second RF switch that couples antenna 401 to the 2.4 GHz receive port 432 (through LNA 413) and a third RF switch that couples antenna 401 to the 2.4 GHz transmit port 433 (through power amplifier 415 and OMN 417). RF switch circuit 412 has a first RF switch that couples antenna 401 to the 5 GHz transmit port 434 (through power amplifier 416 and OMN 418) and a second RF switch that couples antenna 401 to the 5 GHz receive port 435 (through LNA 414). LNAs 413 and 414 are controlled by bias/control circuits 421-422, respectively. Power amplifiers 415-416 are controlled by bias/control circuit 423.

It is desirable to fabricate as many of the elements of FEM 410 as possible on a single wafer in order to reduce system size, cost and complexity. In accordance with one embodiment of the present invention, the RF switch circuits 411-412 are implemented using the FD-SOI transistor structures 102/302 described above, and the bias/control circuits 421-423 are implemented using PD-SOI transistor structures 101/301 described above.

Output impedance matching networks 417-418 and diplexer 402 may be implemented by passive devices fabricated over the substrate 201 (e.g., resistors, inductors, transmission lines, metal-insulator-metal (MIM) devices).

The use of PD-SOI transistors in control circuits 421-423 provide good threshold voltage control within these circuits at a relatively low cost, and further allows for body-biasing during operation, which is not possible with FD-SOI transistors. Note that body-biasing of PD-SOI transistors 101/301 can be accomplished via the separate connection 131 to the body/channel region 123 (outside the cross-sectional views of FIGS. 1 and 3K). The largest drawback associated with using FD-SOI transistors in RF switch circuits 411-412 is threshold voltage sensitivity. However, because the FD-SOI transistors in RF switch circuits 411-412 are typically only operated at a high gate bias (e.g., for n-channel FD-SOI transistors 102/302, a large positive gate-to-source voltage VGS is provided for an on-state, and a large negative VGS voltage is provided for an off-state), the threshold voltage sensitivity of FD-SOI transistors 102/302 does not pose a significant problem for the RF switch circuit application. That is, RF switch performance metrics are much less sensitive to transistor threshold voltage variations than those of other analog and digital circuits. Thus, the present invention enables the use of standard PD-SOI starting wafers (which do not require tight silicon film thickness control) while realizing the advantages of FD-SOI transistors within the RF switch.

Although the present invention has been described in connection with a specific application that includes the integration of RF switches and control circuits of a FEM, it is understood that the present invention can be readily used in other applications that would benefit from the integration of FD-SOI CMOS transistors and PD-SOI CMOS transistors on the same wafer.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. A method comprising:
    forming a first mask over a first region of a silicon layer having a first thickness;
    oxidizing a second region of the silicon layer that is exposed through the first mask, thereby forming an oxide layer that reduces the thickness of the silicon layer in the second region to a second thickness, less than the first thickness;
    removing the first mask;
    removing the oxide layer;
    fabricating a partially-depleted silicon-on-insulator (PD-SOI) transistor in the first region of the silicon layer;
    fabricating a fully-depleted silicon-on-insulator (FD-SOI) transistor in the second region of the silicon layer; and
    forming shallow trench isolation (STI) regions between the PD-SOI transistor and the FD-SOI transistor by:
        forming a second mask over portions of the first and second regions of the silicon layer, wherein the second mask exposes locations where shallow trench isolation (STI) regions are to be formed;
        removing portions of the silicon layer exposed through the second mask, thereby forming trenches that define a first silicon-on-insulator (SOI) region in the first region of the silicon layer and a second SOI region in the second region of the silicon layer;
        depositing a dielectric material over the second mask and into the trenches;
        planarizing the dielectric material to expose the second mask over both the first and second regions of the silicon layer;
        etching upper portions of the dielectric material through the exposed second mask; and then removing the second mask.

2. The method of claim 1, wherein oxidizing the second region of the silicon layer reduces the thickness of the silicon layer in the second region by about 300 to 600 Angstroms.

3. The method of claim 1 wherein the first thickness is in a range of about 700 to 900 Angstroms, and the second thickness is in a range of about 300 to 600 Angstroms.

4. A method comprising:
    forming a silicon-on-insulator (SOI) structure including a first SOI region, a second SOI region and shallow trench isolation (STI) regions located between the first and second SOI regions, wherein the first SOI region, the second SOI region and the STI regions have co-planar upper surfaces and a first thickness;
    forming a first mask over the first SOI region, wherein the first mask exposes the second SOI region;
    thermally oxidizing the second SOI region through the first mask, thereby forming an oxide layer that reduces the thickness of the second SOI region to a second thickness, less than the first thickness;
    removing the oxide layer;
    removing the first mask;
    fabricating a partially-depleted silicon-on-insulator (PD-SOI) transistor in the first SOI region; and
    fabricating a fully-depleted silicon-on-insulator (FD-SOI) transistor in the second SOI region.

5. The method of claim 4, wherein the second SOI region is thermally oxidized to form an oxide layer having a thickness of about 700 to 1400 Angstroms.

6. The method of claim 4, wherein forming the SOI structure comprises:
    forming a second mask over a SOI layer, wherein the second mask covers the first and second SOI regions and exposes locations where the STI regions are to be formed;
    removing portions of the SOI layer exposed through the second mask, thereby forming trenches that define the first SOI region and the second SOI region;
    depositing a dielectric material over the second mask and into the trenches;
    performing a planarization process that removes the second mask and planarizes upper surfaces of the first SOI region, the second SOI region and the dielectric material.

7. The method of claim 1, wherein the STI regions are formed after oxidizing the second region of the silicon layer.

8. The method of claim 1, wherein the STI regions are formed before oxidizing the second region of the silicon layer.

9. The method of claim 1, wherein the exposed second mask is located over both the first and second regions of the silicon layer while etching the upper portions of the dielectric material.

10. The method of claim 6, wherein the planarization process comprises:
    performing chemical mechanical polishing to expose the second mask through the dielectric material;
    etching the dielectric material through the exposed second mask; and
    removing the second mask.

11. The method of claim 10, wherein the exposed second mask is located over both the first and second regions of the silicon layer while etching the dielectric material.

* * * * *